(12) United States Patent
Kim et al.

(10) Patent No.: US 12,191,136 B2
(45) Date of Patent: Jan. 7, 2025

(54) SEMICONDUCTOR DEVICES INCLUDING SEMICONDUCTOR PATTERN

(71) Applicant: SAMSUNG ELECTRONICS CO., LTD., Suwon-si (KR)

(72) Inventors: Hyuncheol Kim, Seoul (KR); Yongseok Kim, Suwon-si (KR); Huijung Kim, Seongnam-si (KR); Satoru Yamada, Yongin-si (KR); Sungwon Yoo, Hwaseong-si (KR); Kyunghwan Lee, Seoul (KR); Jaeho Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/098,174

(22) Filed: Jan. 18, 2023

(65) Prior Publication Data

US 2023/0163132 A1 May 25, 2023

Related U.S. Application Data

(63) Continuation of application No. 17/092,593, filed on Nov. 9, 2020, now Pat. No. 11,581,316.

(30) Foreign Application Priority Data

May 18, 2020 (KR) .................. 10-2020-0058999

(51) Int. Cl.
*H01L 29/74* (2006.01)
*H10B 12/10* (2023.01)

(52) U.S. Cl.
CPC ........... *H01L 29/742* (2013.01); *H10B 12/10* (2023.02)

(58) Field of Classification Search
CPC ... H01L 27/1027; H01L 29/742; H01L 29/74; H10B 12/05; H10B 12/30; H10B 12/00; H10B 99/00; G11C 11/39
See application file for complete search history.

(56) References Cited

U.S. PATENT DOCUMENTS 8,053,822 B2 11/2011 Kim et al.
8,980,699 B2 3/2015 Tang
(Continued)

*Primary Examiner* — Shouxiang Hu
(74) *Attorney, Agent, or Firm* — F. CHAU & ASSOCIATES, LLC

(57) ABSTRACT

A semiconductor device includes a first conductive line and a second conductive line spaced apart from the first conductive line. A semiconductor pattern is disposed between the first conductive line and the second conductive line. The semiconductor pattern includes a first semiconductor pattern having first-conductivity-type impurities disposed adjacent to the first conductive line. A second semiconductor pattern having second-conductivity-type impurities is disposed adjacent to the second conductive line. A third semiconductor pattern is disposed between the first semiconductor pattern and the second semiconductor pattern. The third semiconductor pattern includes a first region disposed adjacent to the first semiconductor pattern and a second region disposed between the first region and the second semiconductor pattern. At least one of the first region and the second region comprises an intrinsic semiconductor layer. A first gate line crosses the first region and a second gate line crosses the second region.

11 Claims, 13 Drawing Sheets

(56) References Cited

U.S. PATENT DOCUMENTS

| | | |
|---|---|---|
| 9,023,723 B2 | 5/2015 | Chang et al. |
| 10,468,414 B2 | 11/2019 | Kim et al. |
| 2017/0053906 A1* | 2/2017 | Or-Bach ............. H01L 27/1027 |
| 2017/0330623 A1 | 11/2017 | Kim et al. |
| 2018/0350685 A1* | 12/2018 | Or-Bach ............. H01L 21/8221 |
| 2019/0013317 A1 | 1/2019 | Luan et al. |
| 2019/0019546 A1 | 1/2019 | Luan |
| 2019/0103407 A1* | 4/2019 | Kim ........................ H01L 28/86 |
| 2019/0206869 A1 | 7/2019 | Kim et al. |
| 2019/0355726 A1 | 11/2019 | Pillarisetty et al. |
| 2020/0043941 A1* | 2/2020 | Kim ........................ H10B 43/40 |
| 2020/0075077 A1 | 3/2020 | Kim et al. |
| 2021/0358913 A1 | 11/2021 | Kim et al. |

* cited by examiner

SEMICONDUCTOR DEVICES INCLUDING SEMICONDUCTOR PATTERN

CROSS-REFERENCE TO THE RELATED APPLICATIONS

This application is a continuation of U.S. patent application Ser. No. 17/092,593 filed on Nov. 9, 2020, which claims priority under 35 U.S.C. § 119 to Korean Patent Application No. 10-2020-0058999, filed on May 18, 2020 in the Korean Intellectual Property Office, the disclosures of which are incorporated by reference in their entireties herein.

1. TECHNICAL FIELD

The exemplary embodiments of the present inventive concepts relate to semiconductor devices including a semiconductor pattern.

2. DISCUSSION OF RELATED ART

Technology for disposing a stack structure on a substrate is being developed to provide highly integrated semiconductor devices. The stack structure may include a plurality of semiconductor patterns. Each of the plurality of semiconductor patterns may have a minimum size for maintaining the desired electrical characteristics. Therefore, research is being conducted concerning diverse technologies which may maintain the desired electrical characteristics of the plurality of semiconductor patterns while minimizing the size of each of the plurality of semiconductor patterns.

SUMMARY

Exemplary embodiments of the present inventive concepts provide semiconductor devices having excellent electrical characteristics and a high level of integration.

According to an exemplary embodiment of the present inventive concepts, a semiconductor device includes a first conductive line and a second conductive line spaced apart from the first conductive line. A semiconductor pattern is disposed between the first conductive line and the second conductive line. The semiconductor pattern includes a first semiconductor pattern disposed adjacent to the first conductive line, the first semiconductor pattern having first-conductivity-type impurities. A second semiconductor pattern is disposed adjacent to the second conductive line. The second semiconductor pattern has second-conductivity-type impurities that are different from the first-conductivity-type impurities. A third semiconductor pattern is disposed between the first semiconductor pattern and the second semiconductor pattern. The third semiconductor pattern includes a first region disposed adjacent to the first semiconductor pattern and a second region disposed between the first region and the second semiconductor pattern. At least one of the first region and the second region comprises an intrinsic semiconductor layer. A first gate line crosses the first region and a second gate line crosses the second region.

According to an exemplary embodiment of the present inventive concepts, a semiconductor device includes a plurality of semiconductor patterns stacked on a substrate. Each of the plurality of semiconductor patterns extends in a first direction that is parallel to an upper surface of the substrate. Each of the plurality of semiconductor patterns includes a first semiconductor pattern having first-conductivity-type impurities, a second semiconductor pattern having second-conductivity-type impurities that are different from the first-conductivity-type impurities, and a third semiconductor pattern disposed between the first semiconductor pattern and the second semiconductor pattern. The third semiconductor pattern includes a first region disposed adjacent to the first semiconductor pattern and a second region disposed between the first region and the second semiconductor pattern. At least one of the first region and the second region comprises an intrinsic semiconductor layer. A first conductive line is connected to the plurality of semiconductor patterns. A plurality of second conductive lines is spaced apart from the first conductive line. Each of the plurality of second conductive lines extends in a second direction that is parallel to the upper surface of the substrate and crosses the first direction. Each of the second conductive lines is connected to a corresponding one of the plurality of semiconductor patterns. A first gate line is disposed adjacent to the plurality of semiconductor patterns and extends in a third direction that crosses the first direction and the second direction. A second gate line is disposed adjacent to the plurality of semiconductor patterns. The second gate line extends in the third direction and is parallel to the first gate line. The first gate line crosses the first region and the second gate line crosses the second region.

According to an exemplary embodiment of the present inventive concepts, a semiconductor device includes a plurality of semiconductor patterns disposed on a substrate. Each of the plurality of semiconductor patterns extends in a first direction that is parallel to an upper surface of the substrate. The plurality of semiconductor patterns is arranged in a second direction that crosses the first direction. Each of the plurality of semiconductor patterns includes a first semiconductor pattern having first-conductivity-type impurities, a second semiconductor pattern having second-conductivity-type impurities that are different from the first-conductivity-type impurities, and a third semiconductor pattern disposed between the first semiconductor pattern and the second semiconductor pattern. The third semiconductor pattern includes a first region disposed adjacent to the first semiconductor pattern and a second region disposed between the first region and the second semiconductor pattern. At least one of the first region and the second region comprises an intrinsic semiconductor layer. A first conductive line is connected to the plurality of semiconductor patterns. A plurality of second conductive lines is spaced apart from the first conductive line. Each of the plurality of second conductive lines extends in a third direction that crosses the first direction and the second direction. Each of the second conductive lines is connected to a corresponding one of the plurality of semiconductor patterns. A first gate line is disposed adjacent to the plurality of semiconductor patterns and extends in the second direction. A second gate line is disposed adjacent to the plurality of semiconductor patterns. The second gate line extends in the second direction and is parallel to the first gate line. The first gate line crosses the first region and the second gate line crosses the second region.

DETAILED DESCRIPTION OF EXEMPLARY EMBODIMENTS

Figure 1:
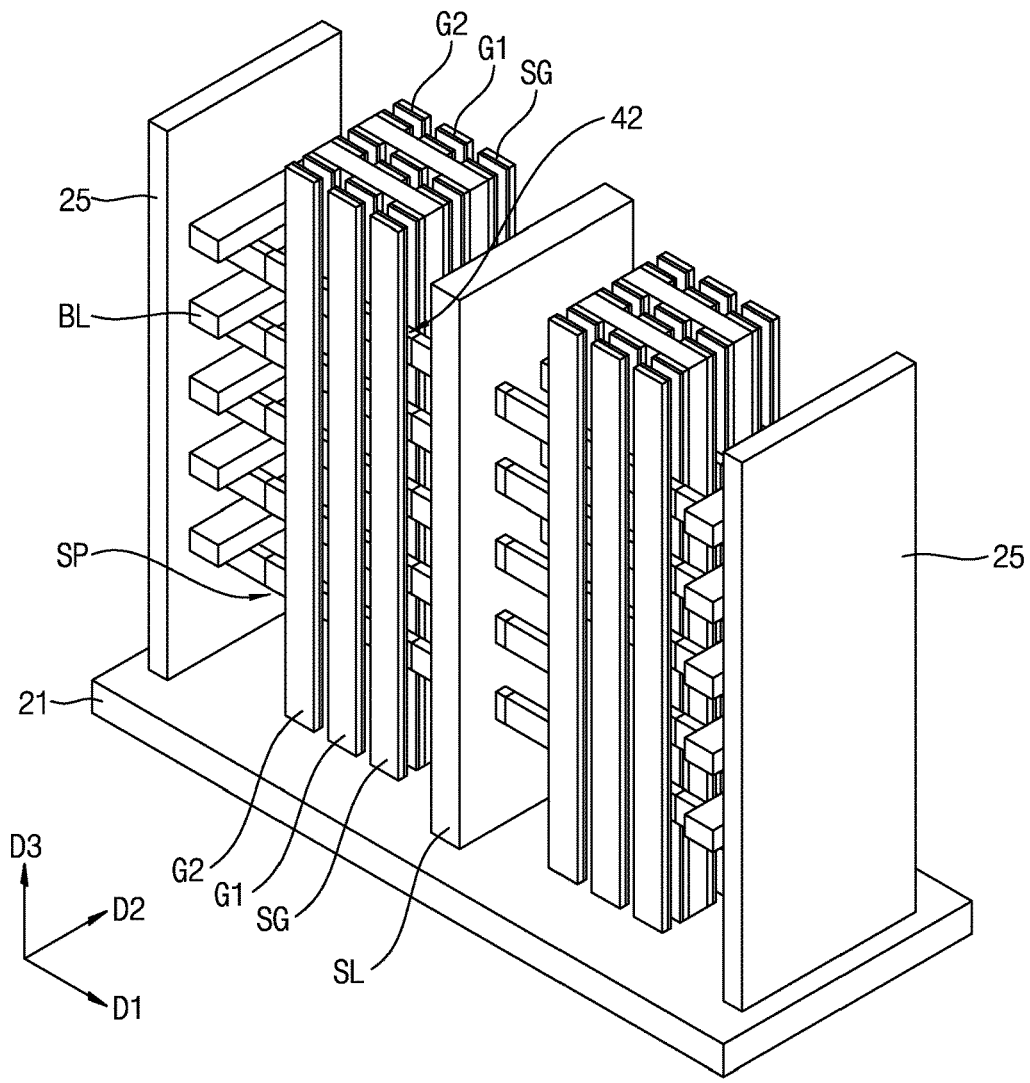
FIGS. 1, 5, 7, 9, 11, 13, 15, 17, 19, 21, 23, and 25 are perspective views of a semiconductor device according to exemplary embodiments of the present inventive concepts.
Figure 2:
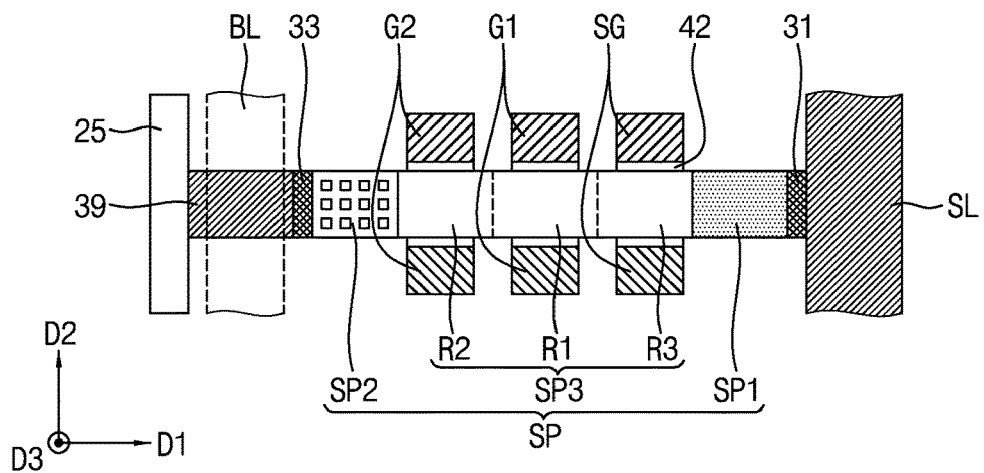
FIGS. 2 to 4, and FIGS. 6, 8, 10, 12, 14, 16, 18, 20, 22, 24, and 26 are plan views of a layout of the semiconductor devices according to exemplary embodiments of the present inventive concepts.
Figure 3:
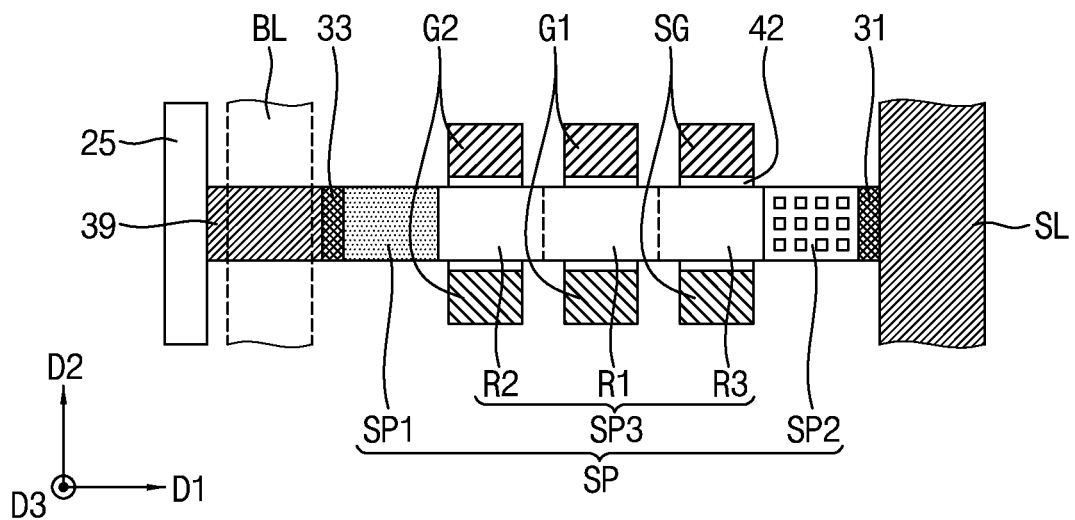
Figure 4:
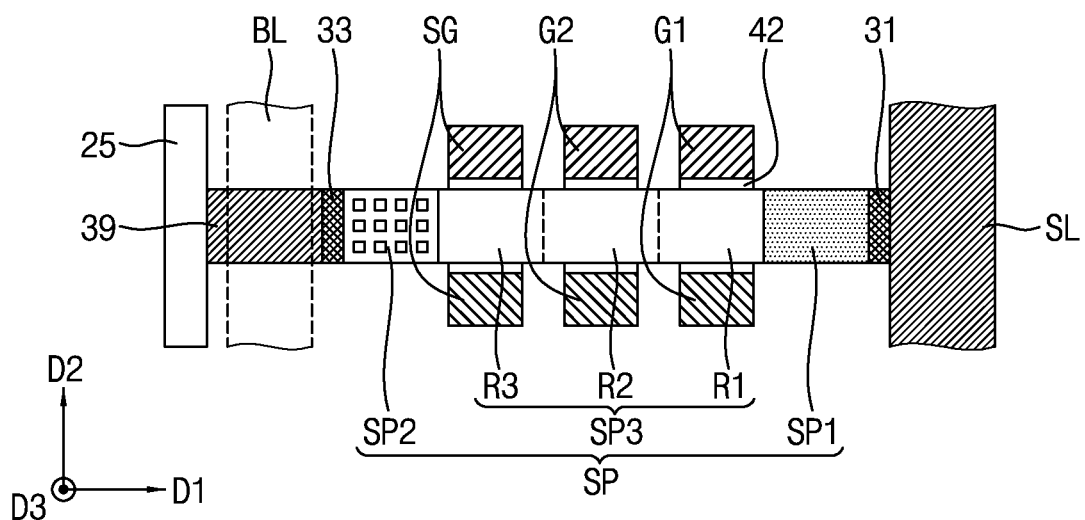

FIG. 1 is a perspective view of a semiconductor device according to an exemplary embodiment of the present inventive concepts. FIGS. 2 to 4 are plan views of layouts of semiconductor devices corresponding to a portion of FIG. 1. Each of the semiconductor devices according to the exemplary embodiments of the present inventive concepts may include a thyristor dynamic random access memory (DRAM) from which a capacitor is omitted. In an exemplary embodiment, each of the semiconductor devices may include a gate voltage application type thyristor having a vertical stack structure.

Referring to FIG. 1, each of the semiconductor devices according to an exemplary embodiment of the present inventive concepts may include a substrate 21, an interlayer insulating layer 25, a gate dielectric layer 42, a source line SL, a plurality of bit lines BL, a plurality of semiconductor patterns SP, a plurality of first gate lines G1, a plurality of second gate lines G2, and a plurality of selection gate lines SG. A first direction D1, a second direction D2 crossing the first direction D1, and a third direction D3 crossing the first direction D1 and the second direction D2 may be defined on the substrate 21. As shown in the exemplary embodiments of FIGS. 1-2, the first direction D1 may correspond to a row direction that is parallel to an upper surface of the substrate 21. The second direction D2 may correspond to a column direction that is also parallel to the upper surface of the substrate 21. As shown in the exemplary embodiments of FIGS. 1-2, the first direction D1 and the second direction D2 may be perpendicular to each other. However, in other exemplary embodiments, the first direction D1 and the second direction D2 may cross each other at various different angles. The third direction D3 may correspond to a vertical direction perpendicular to the upper surface of the substrate 21 and perpendicular to the first and second directions D1, D2. For example, the third direction D3 may be a thickness direction of the substrate 21.

The source line SL may extend from the substrate 21 in the second direction D2 and the third direction D3. In an exemplary embodiment, the source line SL may be in the form of a wall. In an exemplary embodiment, the source line SL may correspond to a common anode line. The source line SL may be referred to as a "first conductive line".

The plurality of bit lines BL may be spaced apart from the source line SL. Each of the plurality of bit lines BL may extend in the second direction D2. In an exemplary embodiment, each of the plurality of bit lines BL may include a line shape, a bar shape, a column shape, or a combination thereof. However, exemplary embodiments of the present inventive concepts are not limited thereto. As shown in the exemplary embodiment of FIG. 1, the plurality of bit lines BL may be stacked in parallel in the third direction D3. In an exemplary embodiment, each of the plurality of bit lines BL may be referred to as a "second conductive line". Each of the plurality of bit lines BL may correspond to a cathode line.

Each of the plurality of semiconductor patterns SP may extend in the first direction D1. In an exemplary embodiment, each of the plurality of semiconductor patterns SP may include a line shape, a bar shape, a column shape, or a combination thereof. However, exemplary embodiments of the present inventive concepts are not limited thereto. In an exemplary embodiment, at least a partial portion of the plurality of semiconductor patterns SP may be arranged in parallel in the second direction D2. In an exemplary embodiment, as shown in the exemplary embodiment of FIG. 1, at least a partial portion of the plurality of semiconductor patterns SP may also be arranged in parallel in the third direction D3. For example, the semiconductor patterns SP may be arranged in the third direction D3 at a plurality of different heights from the substrate 21 and a plurality of semiconductor patterns SP may arranged to be spaced apart from each other in the second direction D2 at each different height. Each of the plurality of semiconductor patterns SP may be electrically connected to a corresponding one of the source line SL and the plurality of bit lines BL. For example, one lateral side of each of the plurality of semiconductor patterns SP may contact the source line SL and the other lateral side of each of the plurality of semiconductor patterns SP may contact a bit line of the plurality of bit lines BL. The plurality of bit lines BL may be electrically connected to the source line SL via the plurality of semiconductor patterns SP.

In an exemplary embodiment, each of the plurality of first gate lines G1, the plurality of second gate lines G2 and the plurality of selection gate lines SG may include a double-gate structure. For example, each of the plurality of first gate lines G1 may include a pair of first gate lines G1. Each of the plurality of second gate lines G2 may include a pair of second gate lines G2. Each of the plurality of selection gate lines SG may include a pair of selection gate lines SG.

Each of the plurality of first gate lines G1, the plurality of second gate lines G2 and the plurality of selection gate lines SG may extend longitudinally in the third direction D3. Each of the plurality of first gate lines G1, the plurality of second gate lines G2 and the plurality of selection gate lines SG may extend across some of the plurality of the semiconductor patterns SP corresponding thereto. In an exemplary embodiment, the plurality of first gate lines G1, the plurality of second gate lines G2 and the plurality of selection gate lines SG may be disposed in parallel.

As shown in the exemplary embodiments of FIGS. 1-2, the plurality of first gate lines G1 may be arranged in parallel in the second direction D2. The plurality of second gate lines G2 may be arranged in parallel with the plurality of first gate lines GL1 in the first direction D1. The plurality of second gate lines G2 may be arranged in parallel in the second direction D2. The plurality of selection gate lines SG may be arranged in parallel with the plurality of first gate lines G1 in the first direction D1. The plurality of selection gate lines SG may be arranged in parallel in the second direction D2.

The gate dielectric layer 42 may be interposed between each of the plurality of first gate lines G1, the plurality of second gate lines G2 and the plurality of selection gate lines SG and a corresponding one of the plurality of semiconductor patterns SP (e.g., in the second direction D2). For example, as shown in the exemplary embodiment of FIG. 2, a gate dielectric layer 42 may directly contact the each lateral side (e.g., in the second direction D2) of the third semiconductor pattern SP3. Each of the plurality of first gate lines G1 and the plurality of second gate lines G2 may correspond to a word line.

In an exemplary embodiment, the substrate 21 may include a semiconductor substrate such as a monocrystalline silicon wafer or a silicon-on-insulator (SOI)) wafer. In an exemplary embodiment, each of the source line SL, the plurality of bit lines BL, the plurality of first gate lines G1, the plurality of second gate lines G2 and the plurality of selection gate lines SG may include a material selected from a metal, metal nitride, metal silicide, metal oxide, conductive carbon, polysilicon, or a combination thereof. For example, each of the source line SL, the plurality of bit lines BL, the plurality of first gate lines G1, the plurality of second gate lines G2 and the plurality of selection gate lines SG may include W, WN, Ru, Ti, TiN, Ta, TaN, Co, Pt, or a combination thereof.

In an exemplary embodiment, the interlayer insulating layer 25 may include a material selected from silicon oxide, silicon nitride, silicon oxynitride, low-k dielectrics, high-k dielectrics, silicon boron nitride (SiBN), silicon carbon nitride (SiCN), or a combination thereof. The gate dielectric layer 42 may include a material selected from silicon oxide, silicon nitride, silicon oxynitride, high-k dielectrics, or a combination thereof.

Referring to the exemplary embodiment of FIG. 2, each of the semiconductor patterns SP may be disposed between the source line SL and a corresponding one of the bit pads 39 (e.g., in the first direction D1). Each bit line BL may be disposed on a corresponding one of the bit pads 39. For example, the bit line BL may directly contact the corresponding bit pad 39. In an exemplary embodiment, the bit pads 39 may include a material selected from metal, metal nitride, metal silicide, metal oxide, conductive carbon, polysilicon, or a combination thereof. For example, the bit pads 39 may include W, WN, Ru, Ti, TiN, Ta, TaN, Co, Pt, or a combination thereof.

As shown in the exemplary embodiment of FIG. 2, each semiconductor pattern SP may include a first semiconductor pattern SP1, a second semiconductor pattern SP2, and a third semiconductor pattern SP3. In an exemplary embodiment, each semiconductor pattern SP may include at least one compound selected from silicon, germanium, silicon-germanium, silicon carbide (SiC) and indium gallium zinc oxide (IGZO). In an exemplary embodiment, each semiconductor pattern SP may include a monocrystalline semiconductor layer, a polycrystalline semiconductor layer, an amorphous semiconductor layer, or a combination thereof. For example, in an exemplary embodiment, each semiconductor pattern SP may include a monocrystalline silicon layer, a polycrystalline silicon layer, an amorphous silicon layer, or a combination thereof.

As shown in the exemplary embodiment of FIG. 2, the first semiconductor pattern SP1 may be disposed adjacent to the source line SL (e.g., in the first direction D1). The source line SL may be electrically connected to the first semiconductor pattern SP1 via a first barrier layer 31. A lateral edge (e.g., in the first direction D1) of the first barrier layer 31 may directly contact the source line SL and an opposing lateral edge (e.g., in the first direction D1) may directly contact the first semiconductor pattern SP1. The second semiconductor pattern SP2 may be disposed adjacent to the bit pad 39 (e.g., in the first direction D1). The bit line BL may be electrically connected to the second semiconductor pattern SP2 via the bit pad 39 and a second barrier layer 33. A lateral edge (e.g., in the first direction D1) of the second barrier layer may directly contact the second semiconductor pattern SP2 and the opposing lateral edge (e.g., in the first direction D1) may directly contact the bit pad 39. The third semiconductor pattern SP3 may be disposed between the first semiconductor pattern SP1 and the second semiconductor pattern SP2 (e.g., in the first direction D1).

As shown in the exemplary embodiment of FIG. 2, the third semiconductor pattern SP3 may include a first region R1, a second region R2, and a third region R3 that are arranged in the first direction D1. For example, as shown in the exemplary embodiment of FIG. 2, the first region R1 may be disposed between the second region R2 and the third region R3 (e.g., in the first direction D1). The first region R1 may be in continuity with side surfaces of the second region R2 and the third regions R3. For example, lateral ends of the first region R1 (e.g., in the first direction D1) may directly contact a lateral end of the second region R2 and a lateral end of the third region R3, respectively. The second region R2 may be disposed between the first region R1 and the second semiconductor pattern SP2 (e.g., in the first direction D1). The second region R2 may be in continuity with side surfaces of the first region R1 and the second semiconductor pattern SP2. For example, lateral ends of the second region R2 (e.g., in the first direction D1) may directly contact a lateral end of the first region R1 and a lateral end of the second semiconductor pattern SP2, respectively. The third region R3 may be disposed between the first region R1 and the first semiconductor pattern SP1 (e.g., in the first direction D1). The third region R3 may be in continuity with side surfaces of the first region R1 and the first semiconductor pattern SP1. For example, lateral ends of the third region R3 (e.g., in the first direction D1) may directly contact a lateral end of the first region R1 and a lateral end of the first semiconductor pattern SP1, respectively.

In an exemplary embodiment, each of the first semiconductor pattern SP1, the second semiconductor pattern SP2, the first region R1, the second region R2, and the third region R3 of the third semiconductor pattern SP3 may include a compound selected from silicon, germanium, silicon-germanium, silicon carbide (SiC), indium gallium zinc oxide (IGZO), or a combination thereof. In an exemplary embodiment, each of the first semiconductor pattern SP1, the second semiconductor pattern SP2, the first region R1, the second region R2, and the third region R3 of the third semiconductor pattern SP3 may include a monocrystalline semiconductor layer, a polycrystalline semiconductor layer, an amorphous semiconductor layer, or a combination thereof. For example, each of the first semiconductor pattern SP1, the second semiconductor pattern SP2, the first region R1, the second region R2, and the third region R3 of the third semiconductor pattern SP3 may include a monocrystalline silicon layer, a polycrystalline silicon layer, an amorphous silicon layer, or a combination thereof.

The first semiconductor pattern SP1 may include first-conductivity-type impurities. The first-conductivity-type impurities may include N-type impurities or P-type impurities. In an exemplary embodiment, the first-conductivity-type impurities may include N-type impurities. The first semiconductor pattern SP1 may include a silicon layer containing N-type impurities. In an exemplary embodiment, the N-type impurities may include a compound selected from P, As, or a combination thereof. The P-type impurities may include a compound selected from B, BF, or a combination thereof.

The second semiconductor pattern SP2 may include second-conductivity-type impurities that are different from the first-conductivity-type impurities. For example, the second-conductivity-type impurities may include N-type impurities or P-type impurities. For example, the first-conductivity-type impurities may include N-type impurities and the second-conductivity-type impurities may include P-type impurities. In another exemplary embodiment, the first-conductivity-type impurities may include P-type impurities and the second-conductivity-type impurities may include N-type impurities. In an exemplary embodiment, the second-conductivity-type impurities may include P-type impurities. The second semiconductor pattern SP2 may include a silicon layer containing P-type impurities.

At least one of the first region R1 and the second region R2 of the third semiconductor pattern SP3 may include an intrinsic semiconductor layer. For example, at least one of the first region R1 and the second region R2 may include an intrinsic silicon layer. However, exemplary embodiments of the present inventive concepts are not limited thereto. For example, in an exemplary embodiment, each of the first region R1, the second region R2 and the third region R3 of the third semiconductor pattern SP3 may include an intrinsic semiconductor layer. In an exemplary embodiment, the third region R3 of the third semiconductor pattern SP3 may include a semiconductor layer containing N-type impurities. However, exemplary embodiments of the present inventive concepts are not limited thereto. For example, in an exemplary embodiment, the third region R3 of the third semiconductor pattern SP3 may be omitted. In an exemplary embodiment, each of the first region R1 and the second region R2 may include an intrinsic semiconductor layer.

In an exemplary embodiment, the first region R1 may include an intrinsic semiconductor layer and the second region R2 may include a semiconductor layer containing the first-conductivity-type impurities. In another exemplary embodiment, the first region R1 may include a semiconductor layer containing the second-conductivity-type impurities, whereas the second region R2 may include an intrinsic semiconductor layer.

The pair of first gate lines G1 may be disposed on opposite side surfaces of the first region R1 of the third semiconductor pattern SP3, respectively (e.g., in the second direction D2) and may cross the first region R1. In an exemplary embodiment, the pair of first gate lines G1 may include a double-gate structure. The pair of first gate lines G1 may be electrically equivalent. The pair of second gate lines G2 may be disposed on opposite side surfaces of the second region R2 of the third semiconductor pattern SP3, respectively (e.g., in the second direction D2) and may cross the second region R2. The pair of second gate lines G2 may include a double-gate structure. The pair of second gate lines G2 may be electrically equivalent.

In an exemplary embodiment, an operating current may be applied to the pair of second gate lines G2 in a direction different from the operating current applied to the pair of first gate lines G1. In an exemplary embodiment, a first operating current of about +1.5 V may be applied to the pair of first gate lines G1, and at the same time, a second operating current of about −1.5 V may be applied to the pair of second gate lines G2. In another exemplary embodiment, a first operating current of about −2 V may be applied to the pair of first gate lines G1, and at the same time, a second operating current of about +2 V may be applied to the pair of second gate lines G2.

The pair of selection gate lines SG may be disposed on opposite side surfaces of the third region R3 of the third semiconductor pattern SP3 (e.g., in the second direction D2) and may cross the third region R3. The pair of selection gate lines SG may include a double-gate structure. The pair of selection gate lines SG may be electrically equivalent. The gate dielectric layer 42 may be interposed between the pair of first gate lines G1 and the first region R1 of the third semiconductor pattern SP3 (e.g., in the second direction D2), between the pair of second gate lines G2 and the second region R2 of the third semiconductor pattern SP3 (e.g., in the second direction D2), and between the pair of selection gate lines SG and the third region R3 of the third semiconductor pattern SP3 (e.g., in the second direction D2).

The first barrier layer 31 may be disposed between the source line SL and the first semiconductor pattern SP1 (e.g., in the first direction D1). The first barrier layer 31 may directly contact the source line SL and the first semiconductor pattern SP1. The second barrier layer 33 may be disposed between the bit pad 39 and the second semiconductor pattern SP2 (e.g., in the first direction D1). The second barrier layer 33 may directly contact the bit pad 39 and the second semiconductor pattern SP2. In an exemplary embodiment, each of the first barrier layer 31 and the second barrier layer 33 may include Ti, TiN, Ta, TaN, metal silicide, or a combination thereof.

Again referring to the exemplary embodiments of FIGS. 1 and 2, the source line SL, the plurality of bit lines BL, the plurality of semiconductor patterns SP, the plurality of first gate lines G1, and the plurality of second gate lines G2 may constitute a plurality of thyristor DRAM cells. In semiconductor devices according to exemplary embodiments of the present inventive concepts, a thyristor thereof may have a high conductance state in which a relatively large amount of current flows through the thyristor or a low conductance state in which a relatively small amount of current flows through the thyristor when forward biases of the same voltage are applied to the thyristor. The semiconductor devices according to the exemplary embodiments of the present inventive concepts (e.g., thyristor DRAM cells) may have states of "1" and "0" using high and low conductance states of the thyristor.

In an exemplary embodiment, each of the semiconductor devices may include the plurality of semiconductor patterns SP stacked on the substrate 21. Some of the plurality of semiconductor patterns SP may be sequentially vertically stacked on the substrate 21 in the third direction D3. Each of the plurality of semiconductor patterns SP may extend longitudinally in the first direction D1 parallel to the upper surface of the substrate 21. Each of the plurality of semiconductor patterns SP may include the first semiconductor pattern SP1, which includes the first-conductivity-type impurities, the second semiconductor pattern SP2, which includes the second-conductivity-type impurities that are different from the first-conductivity-type impurities, and the third semiconductor pattern SP3, which is disposed between the first semiconductor pattern SP1 and the second semiconductor pattern SP2 (e.g., in the first direction D1). The third semiconductor pattern SP3 may include the first region R1, which is disposed adjacent to the first semiconductor pattern SP1, and the second region R2, which is disposed between the first region R1 and the second semiconductor pattern SP2. At least one of the first region R1 and the second region R2 may include an intrinsic semiconductor layer.

The semiconductor device may include a source line SL, which is connected to the plurality of semiconductor patterns SP. The semiconductor device may also include a plurality of bit lines BL, which is spaced apart from the source line SL. Each of the plurality of bit lines BL may extend longitudinally in the second direction D2 parallel to the upper surface of the substrate 21 while crossing the first direction D1. Each of the plurality of bit lines BL may be connected to a corresponding one of the plurality of semiconductor patterns SP. The semiconductor device may include first gate lines G1, which are disposed adjacent to the first region R1 of the third semiconductor pattern SP3 (e.g., in the second direction D2) while extending in the third direction D3 crossing the first direction D1 and the second direction D2. The semiconductor device may include second gate lines G2, which are disposed adjacent to the second region R2 of the third semiconductor pattern SP3 (e.g., in the second direction D2) while being parallel to the first gate lines G1. The first gate lines G1 may cross the first region R1. The second gate line G2 may cross the second region R2.

The third semiconductor pattern SP3 may include the third region R3 which is disposed between the first region R1 and the first semiconductor pattern SP1. The semiconductor device may include selection gate lines SG, which are disposed adjacent to the plurality of semiconductor patterns SP (e.g., in the second direction D2) while being parallel to the first gate lines G1 and the second gate lines G2. The selection gate lines SG may cross the third region R3.

Referring to FIG. 3, in contrast to the exemplary embodiment of FIG. 2, the second semiconductor pattern SP2 in the exemplary embodiment of FIG. 3 may be disposed adjacent to the source line SL (e.g., in the first direction D1) and the first semiconductor pattern SP1 may be disposed adjacent to the bit line BL (e.g., in the first direction D1). The source line SL may be electrically connected to the second semiconductor pattern SP2 via the first barrier layer 31. For example, lateral ends of the second semiconductor pattern SP2 (e.g., in the first direction D1) may directly contact a lateral end of the third region R3 of the third semiconductor pattern SP3 and the first barrier layer 31, respectively. The first semiconductor pattern SP1 may be disposed adjacent to the bit pad 39 (e.g., in the first direction D1). The bit line BL may be electrically connected to the first semiconductor pattern SP1 via the bit pad 39 and the second barrier layer 33. The third semiconductor pattern SP3 may be disposed between the first semiconductor pattern SP1 and the second semiconductor pattern SP2 (e.g., in the first direction D1). As shown in the exemplary embodiment of FIG. 3, the third semiconductor pattern SP3 may include a first region R1, a second region R2, and a third region R3. The second region R2 may be disposed between the first region R1 and the first semiconductor pattern SP1 (e.g., in the first direction D1). The third region R3 may be disposed between the first region R1 and the second semiconductor pattern SP2 (e.g., in the first direction D1).

Referring to the exemplary embodiment of FIG. 4, the third semiconductor pattern SP3 may be disposed between the first semiconductor pattern SP1 and the second semiconductor pattern SP2 (e.g., in the first direction D1). The third semiconductor pattern SP3 may include a first region R1, a second region R2, and a third region R3. However, in contrast to the exemplary embodiment shown in FIG. 2, in the exemplary embodiment of FIG. 4, the first region R1 of the third semiconductor pattern SP3 may be disposed between the second region R2 and the first semiconductor pattern SP1 (e.g., in the first direction D1). The first region R1 may be in continuity with side surfaces of the second region R2 and the first semiconductor pattern SP1. For example, lateral ends of the first region R1 (e.g., in the first direction D1) may directly contact a lateral end of the second region R2 and a lateral end of the first semiconductor pattern SP1, respectively. The second region R2 may be disposed between the first region R1 and the third region R3 (e.g., in the first direction D1). The second region R2 may be in continuity with side surfaces of the first region R1 and the third region R3. For example, lateral ends of the second region R2 (e.g., in the first direction D1) may directly contact a lateral end of the first region R1 and a lateral end of the third region R3, respectively. The third region R3 may be disposed between the second region R2 and the second semiconductor pattern SP2 (e.g., in the first direction D1). The third region R3 may be in continuity with side surfaces of the second region R2 and the second semiconductor pattern SP2. For example, lateral ends of the third region R3 (e.g., in the first direction D1) may directly contact a lateral end of the second region R2 and a lateral end of the second semiconductor pattern SP2, respectively. However, similar to the exemplary embodiment of FIG. 2, in the exemplary embodiment of FIG. 4, the first gate lines G1 may be adjacent to the first region R1 of the third semiconductor pattern SP3 (e.g., in the second direction D2), the second gate lines G2 may be adjacent to the second region R2 of the third semiconductor pattern SP3 (e.g., in the second direction D2) and the selection gate lines SG may be adjacent to the third region R3 of the third semiconductor pattern SP3 (e.g., in the second direction D2).

Figure 5:
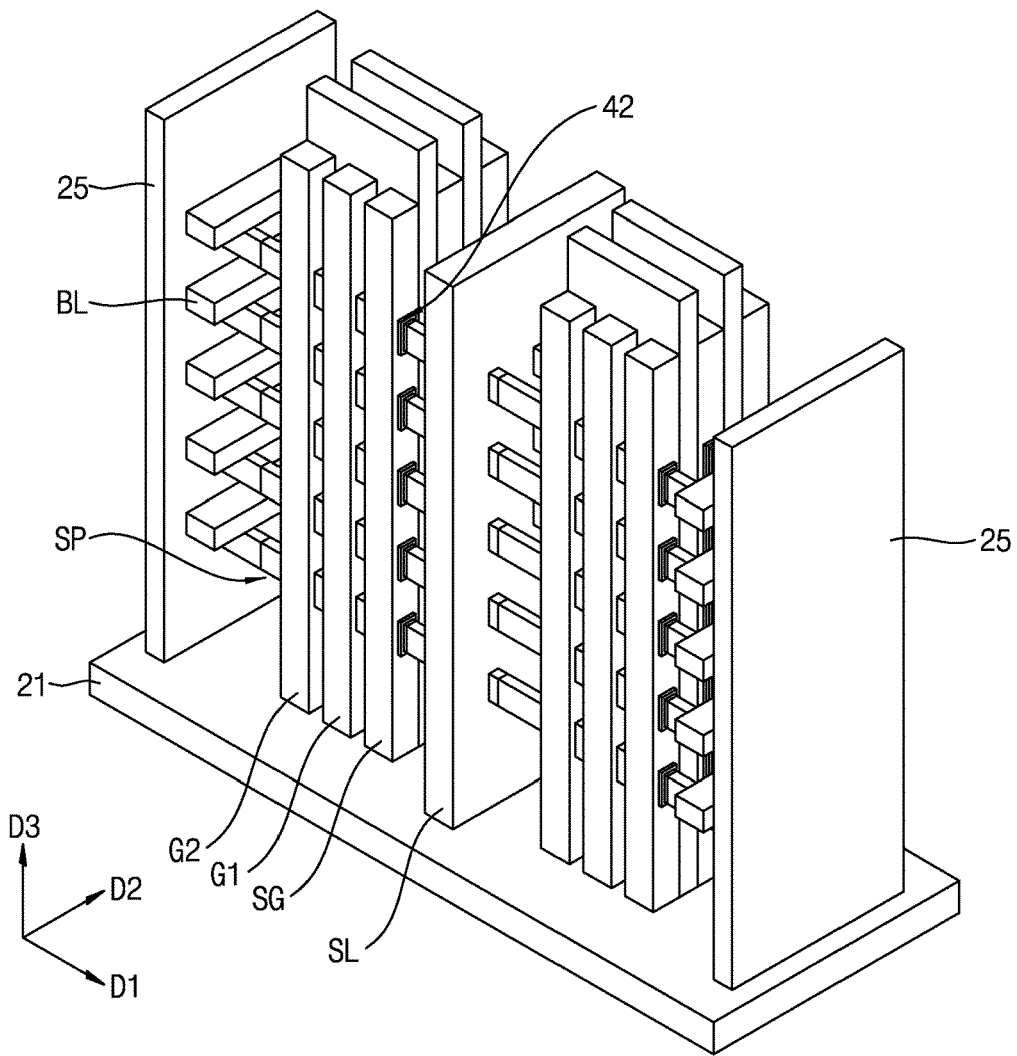
Figure 6:
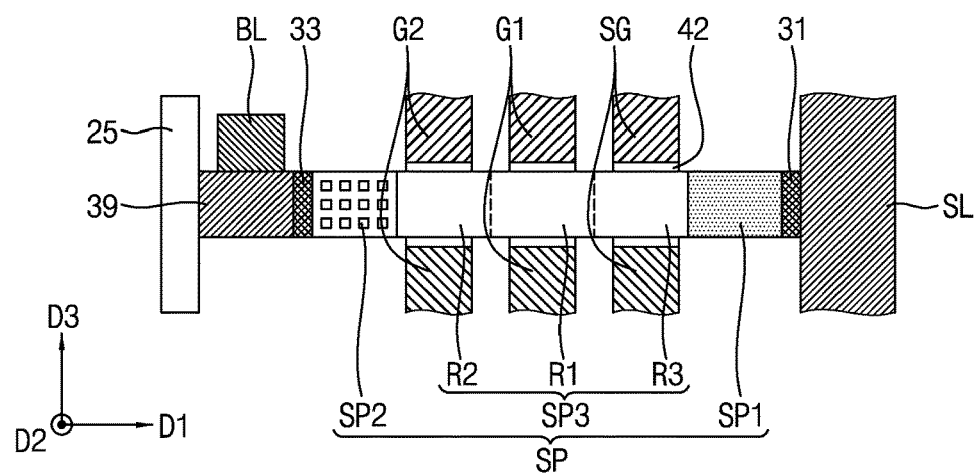

FIG. 5 is a perspective view of a semiconductor devices according to an exemplary embodiment of the present inventive concepts. FIG. 6 is a plan view of a layout of a semiconductor device corresponding to a portion of FIG. 5.

Referring to the exemplary embodiments of FIGS. 5 and 6, each of the plurality of first gate lines G1, the plurality of second gate lines G2 and the plurality of selection gate lines SG may include a gate all around (GAA) structure. For example, each of the plurality of first gate lines G1 may surround upper, lower and side surfaces of the first region R1. Each of the plurality of second gate lines G2 may surround upper, lower and side surfaces of the second region R2. Each of the plurality of selection gate lines SG may surround upper, lower and side surfaces of the third region R3.

Figure 7:
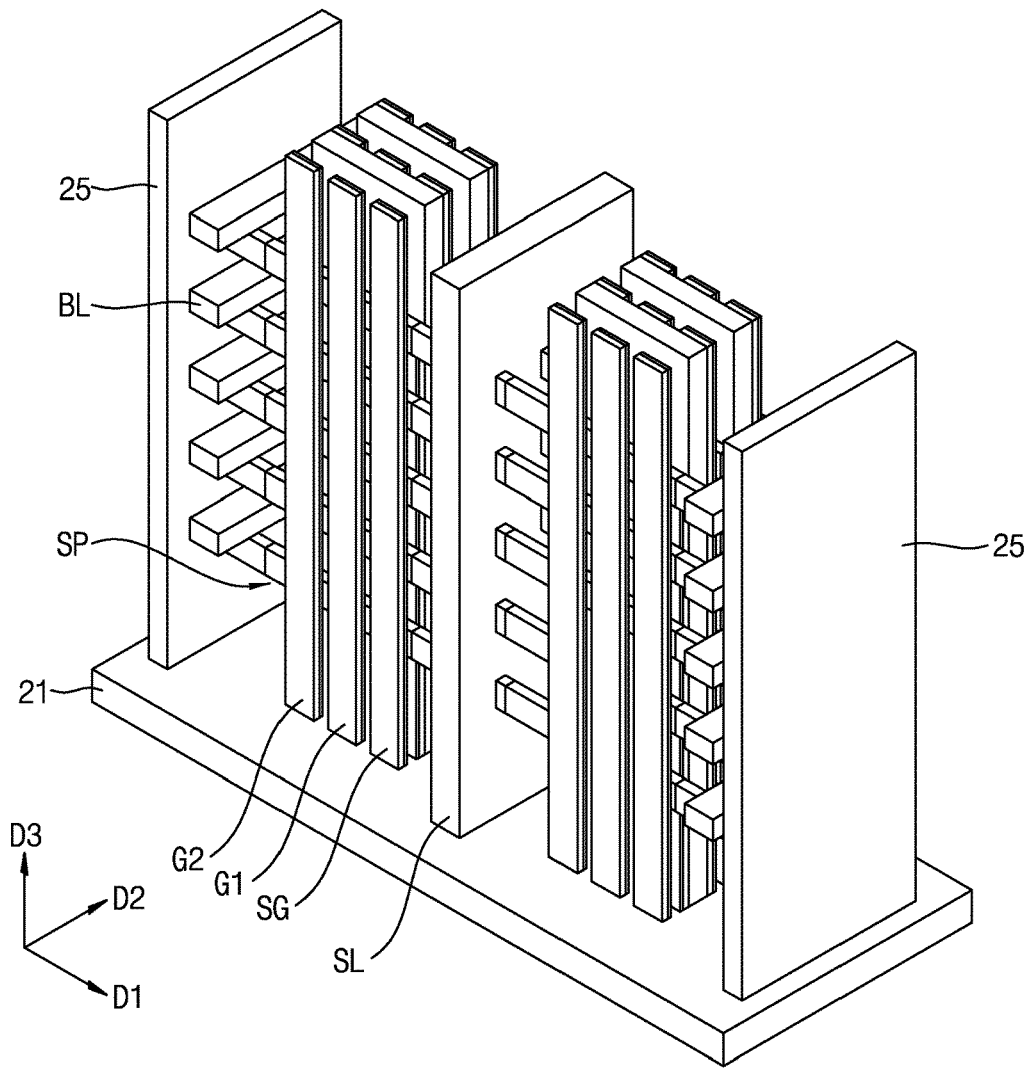
Figure 8:
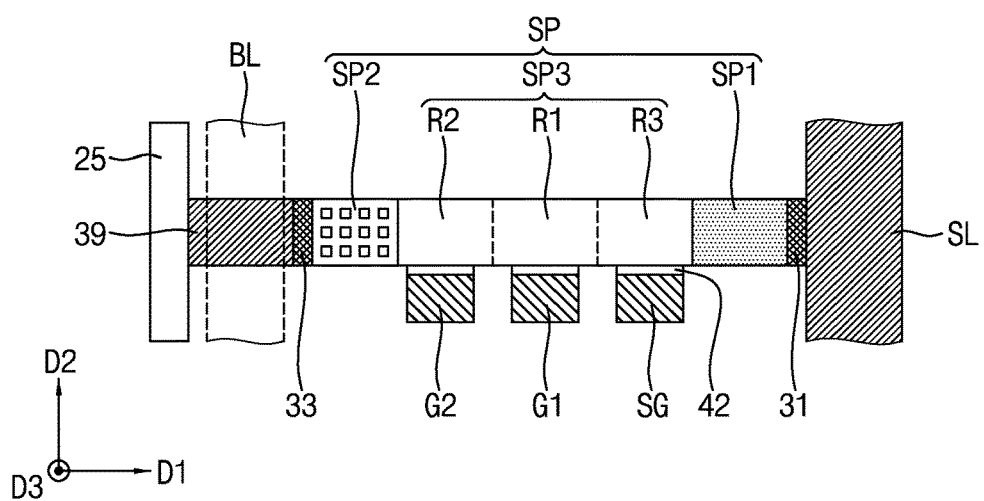

FIG. 7 is a perspective view of a semiconductor device according to an exemplary embodiment of the present inventive concepts. FIG. 8 is a plan view of a layout of a semiconductor device corresponding to a portion of FIG. 7.

Referring to the exemplary embodiments of FIGS. 7 and 8, each of the plurality of first gate lines G1 may cross only one side surface of the first region R1 in the third direction D3. Each of the plurality of second gate lines G2 may cross only one side surface of the second region R2 in the third direction D3. Each of the plurality of selection gate lines SG may cross only one side surface of the third region R3 in the third direction D3. For example, as shown in the exemplary embodiment of FIG. 8, the second gate line G2 is adjacent to only one side of the second region R2 of the third semiconductor pattern SP3 (e.g., in the second direction D2), the first gate line G1 is adjacent to only one side of the first region R1 of the third semiconductor pattern SP3 (e.g., in the second direction D2), and the selection gate line SG is adjacent to only one side of the third region R3 of the third semiconductor pattern SP3 (e.g., in the second direction D2).

Figure 9:
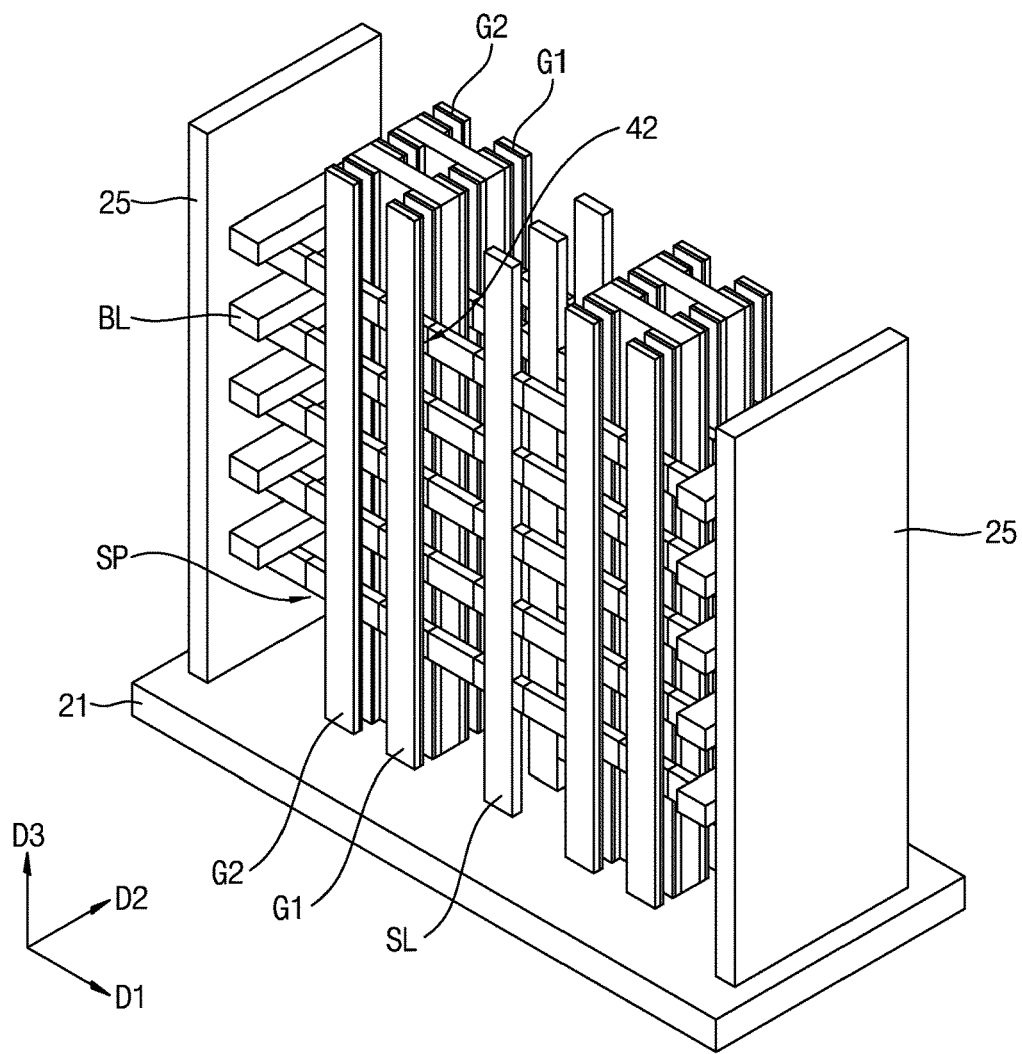
Figure 10:
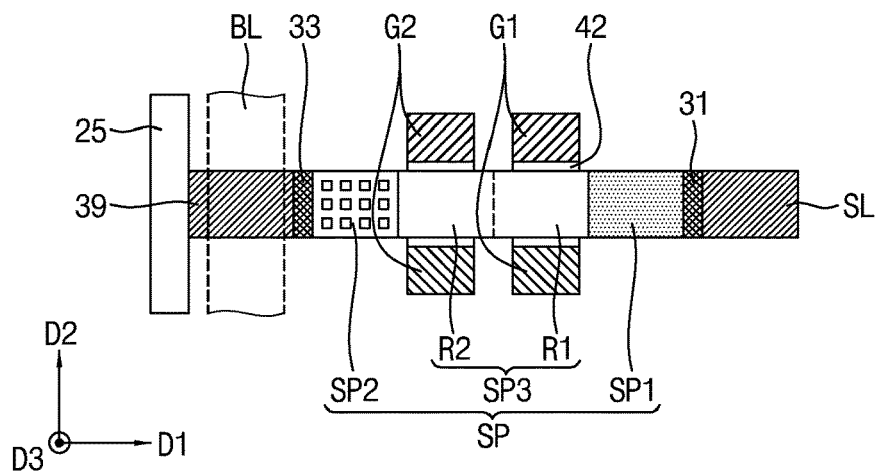

FIG. 9 is a perspective view of a semiconductor device according to an exemplary embodiment of the present inventive concepts. FIG. 10 is a plan view of a layout of a semiconductor device corresponding to a portion of FIG. 9.

Referring to the exemplary embodiments of FIGS. 9 and 10, each of the plurality of source lines SL may extend longitudinally from the substrate 21 in the third direction D3. The plurality of source lines SL may be arranged in parallel in the second direction D2 and are spaced apart from each other in the second direction D2. In an exemplary embodiment, each of the plurality of source lines SL may include a line shape, a bar shape, a column shape, or a combination thereof. However, exemplary embodiments of the present inventive concepts are not limited thereto. Each of the plurality of source lines SL may be referred to as a "first conductive line".

As shown in the exemplary embodiment of FIG. 10, the third semiconductor pattern SP3 may include a first region R1 and a second region R2. In contrast, to the exemplary embodiment of FIG. 2, the third semiconductor pattern SP3 in the exemplary embodiment of FIG. 10 does not include a third region R3. The first region R1 may be disposed between the second region R2 and the first semiconductor pattern SP1 (e.g., in the first direction D1). The first region R1 may be in continuity with side surfaces of the second region R2 and the first semiconductor pattern SP1. For example, lateral ends of the first region R1 (e.g., in the first direction D1) may directly contact a lateral end of the second region R2 and a lateral end of the first semiconductor pattern SP1, respectively. The second region R2 may be disposed between the first region R1 and the second semiconductor pattern SP2 (e.g., in the first direction D1). The second region R2 may be in continuity with side surfaces of the first region R1 and the second semiconductor pattern SP2. For example, lateral ends of the second region R2 (e.g., in the first direction D1) may directly contact a lateral end of the first region R1 and a lateral end of the second semiconductor pattern SP2, respectively.

Each of the plurality of first gate lines G1 may include a pair of first gate lines G1. The pair of first gate lines G1 may be disposed on opposite side surfaces of the first region R1, respectively (e.g., in the second direction D2). Each of the plurality of second gate lines G2 may include a pair of second gate lines G2. The pair of second gate lines G2 may be disposed on opposite side surfaces of the second region R2, respectively (e.g., in the second direction D2).

Figure 11:
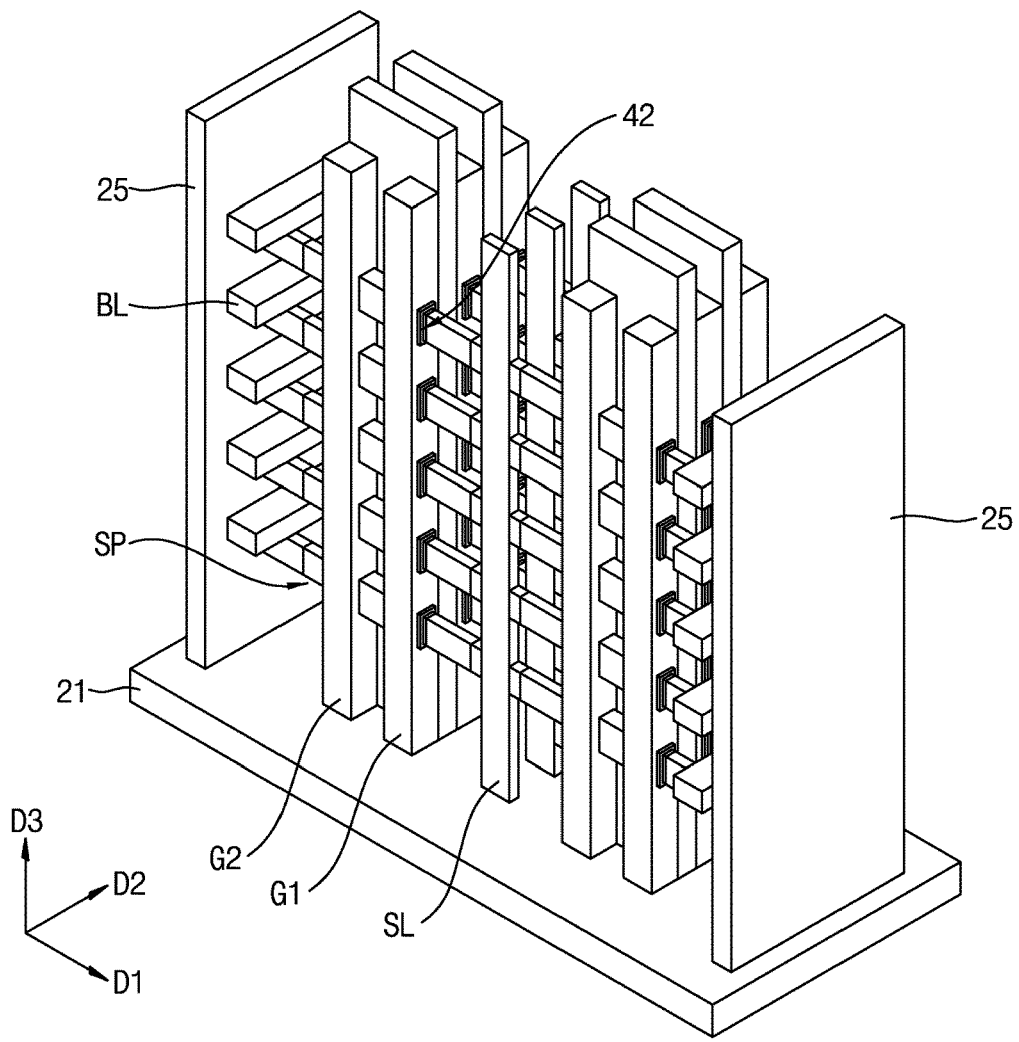
Figure 12:
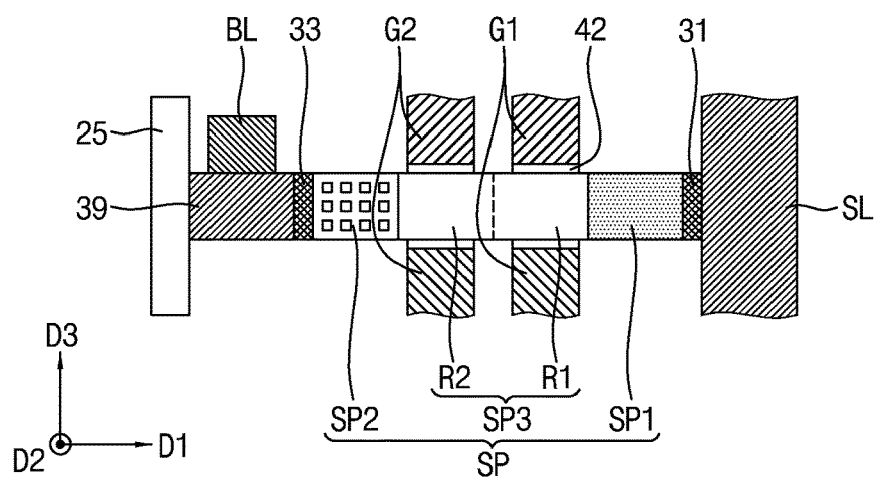

FIG. 11 is a perspective view of a semiconductor device according to an exemplary embodiment of the present inventive concepts. FIG. 12 is a plan view of a layout of a semiconductor device corresponding to a portion of FIG. 11.

Referring to the exemplary embodiments of FIGS. 11 and 12, each of the plurality of source lines SL may extend longitudinally from the substrate 21 in the third direction D3. Each of the plurality of first gate lines G1 and the plurality of second gate lines G2 may include a gate all around (GAA) structure.

Figure 13:
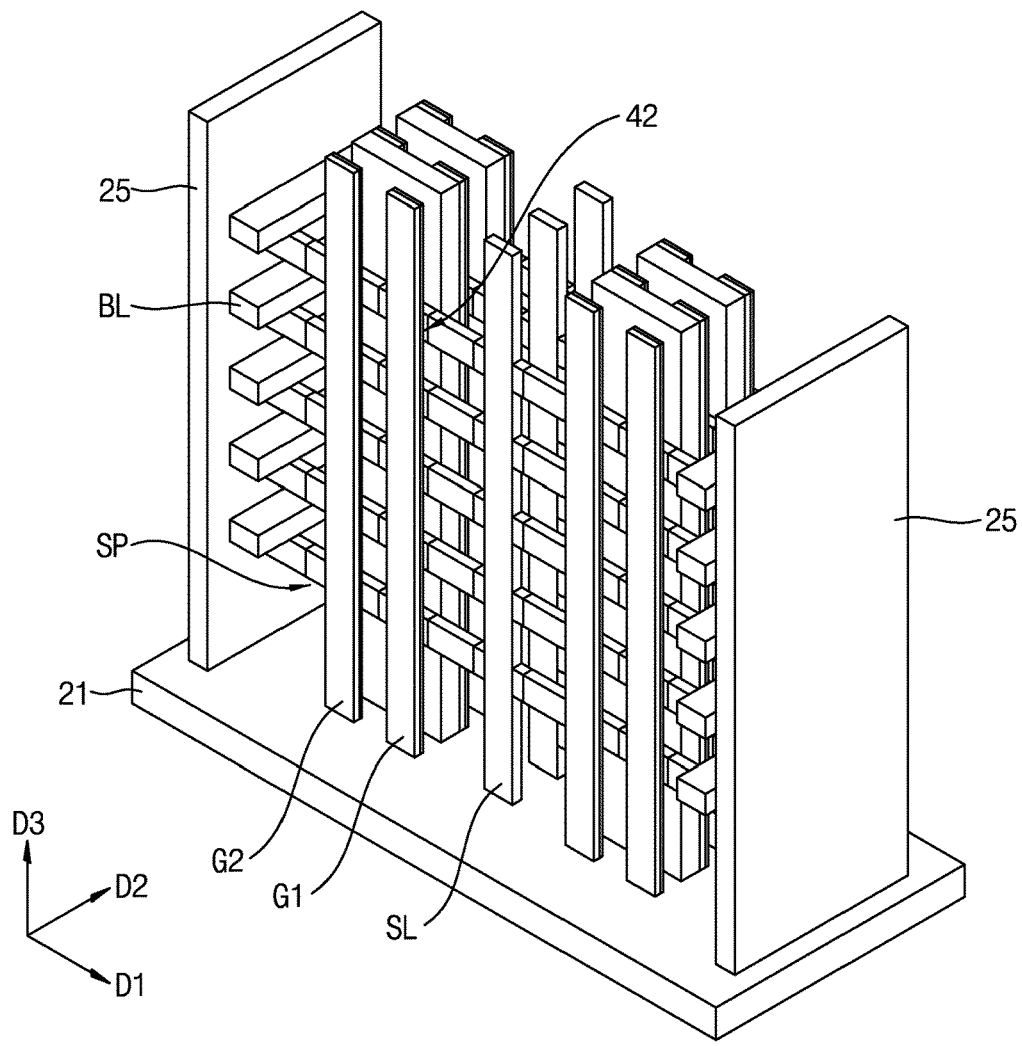
Figure 14:
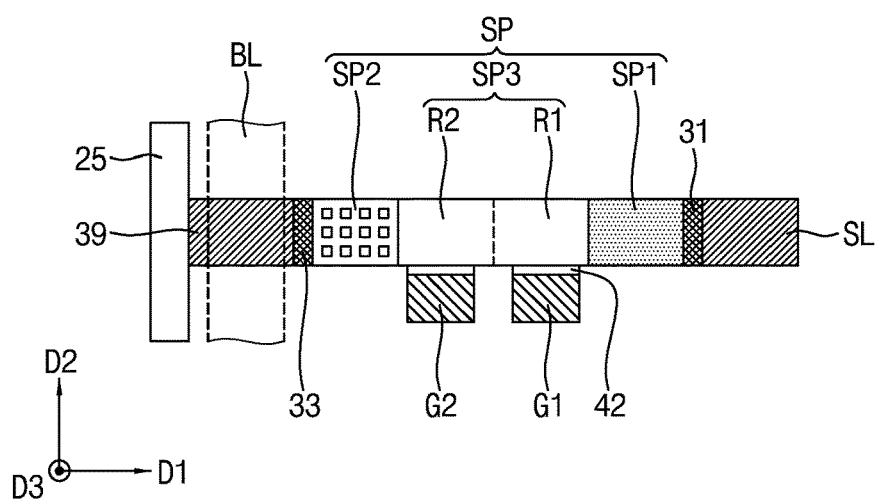

FIG. 13 is a perspective view of a semiconductor devices according to an exemplary embodiment of the present inventive concepts. FIG. 14 is a plan view of a layout corresponding to a portion of FIG. 13.

Referring to the exemplary embodiments of FIGS. 13 and 14, each of the plurality of source lines SL may extend longitudinally from the substrate 21 in the third direction D3. Each of the plurality of first gate lines G1 may cross only one side surface of the first region R1 in the third direction D3. Each of the plurality of second gate lines G2 may cross only one side surface of the second region R2 in the third direction D3. For example, as shown in the exemplary embodiment of FIG. 14, the second gate line G2 is adjacent to only one side of the second region R2 of the third semiconductor pattern SP3 (e.g., in the second direction D2) and the first gate line G1 is adjacent to only one side of the first region R1 of the third semiconductor pattern SP3 (e.g., in the second direction D2).

Figure 15:
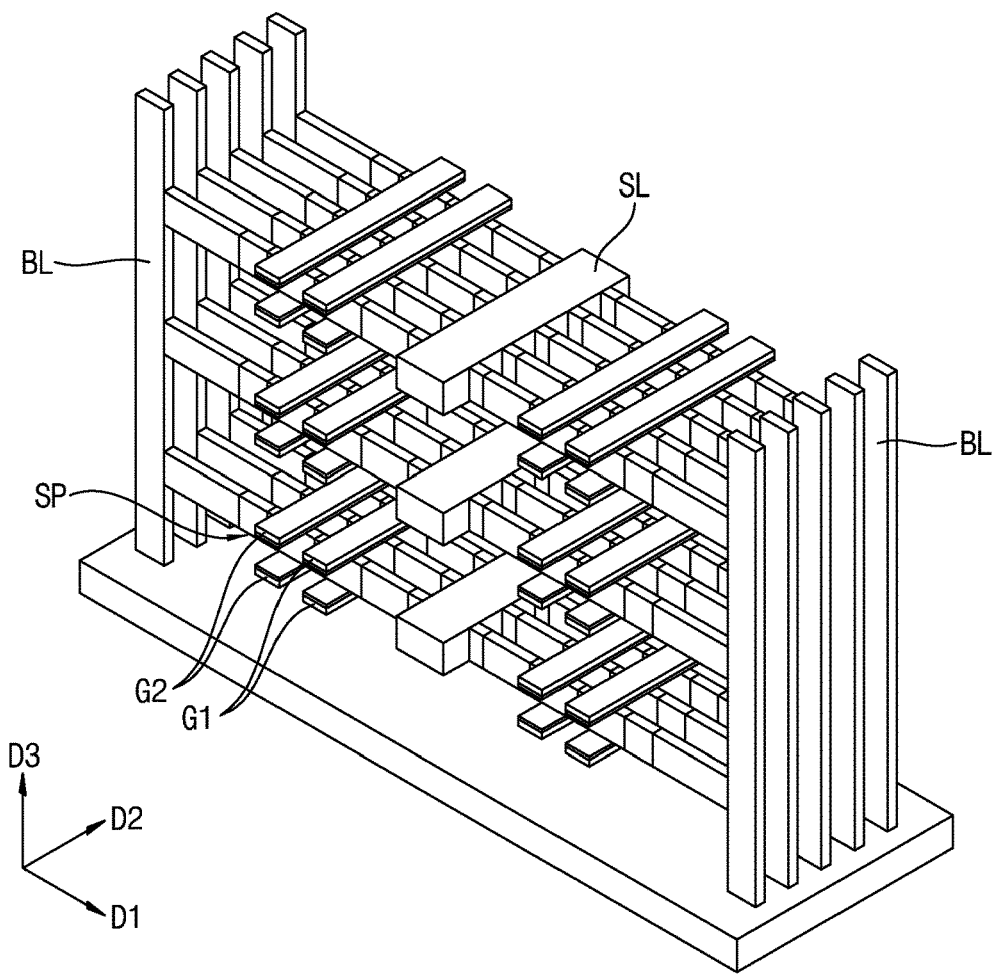
Figure 16:
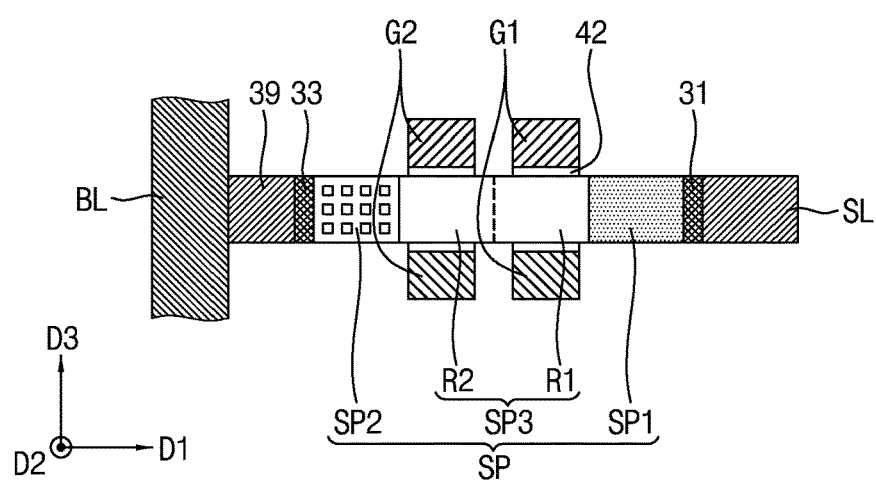

FIG. 15 is a perspective view of a semiconductor devices according to an exemplary embodiment of the present inventive concepts. FIG. 16 is a plan view of a layout of a semiconductor device corresponding to a portion of FIG. 15.

Referring to the exemplary embodiments of FIGS. 15 and 16, a plurality of sequentially-stacked source lines SL may be disposed on the substrate 21. The plurality of source lines SL may be stacked in parallel in the third direction D3 and may be spaced apart from each other in the third direction D3. The plurality of source lines SL may extend longitudinally in the second direction D2. Each of the plurality of bit lines BL may extend longitudinally in the third direction D3. The plurality of bit lines BL may be arranged in parallel in the second direction D2 and may be spaced apart from each other in the second direction D2. Each of the plurality of bit lines BL may directly contact a side surface of the corresponding bit pad 39.

As shown in the exemplary embodiment of FIG. 16, each of the plurality of semiconductor patterns SP may include a first semiconductor pattern SP1, a second semiconductor pattern SP2, and a third semiconductor pattern SP3. The third semiconductor pattern SP3 may include a first region R1 and a second region R2. Each of the plurality of first gate lines G1 and the plurality of second gate lines G2 may extend longitudinally in the second direction D2. The plurality of first gate lines G1 may be disposed in parallel in the third direction D3. The plurality of second gate lines G2 may be disposed in parallel in the third direction D3.

Each of the plurality of first gate lines G1 and the plurality of second gate lines G2 may include a double-gate structure. Each of the plurality of first gate lines G1 may include a pair of first gate lines G1. The pair of first gate lines G1 may cross upper and lower surfaces of the first region R1 in the second direction D2, respectively. The pair of first gate lines G1 may be disposed adjacent to the upper and lower surfaces of the first region R1 in the third direction DR3. Each of the plurality of second gate lines G2 may include a pair of second gate lines G2. The pair of second gate lines G2 may cross upper and lower surfaces of the second region R2 in the second direction D2, respectively. The pair of second gate lines G2 may be disposed adjacent to the upper and lower surfaces of the second region R2 in the third direction DR3.

Figure 17:
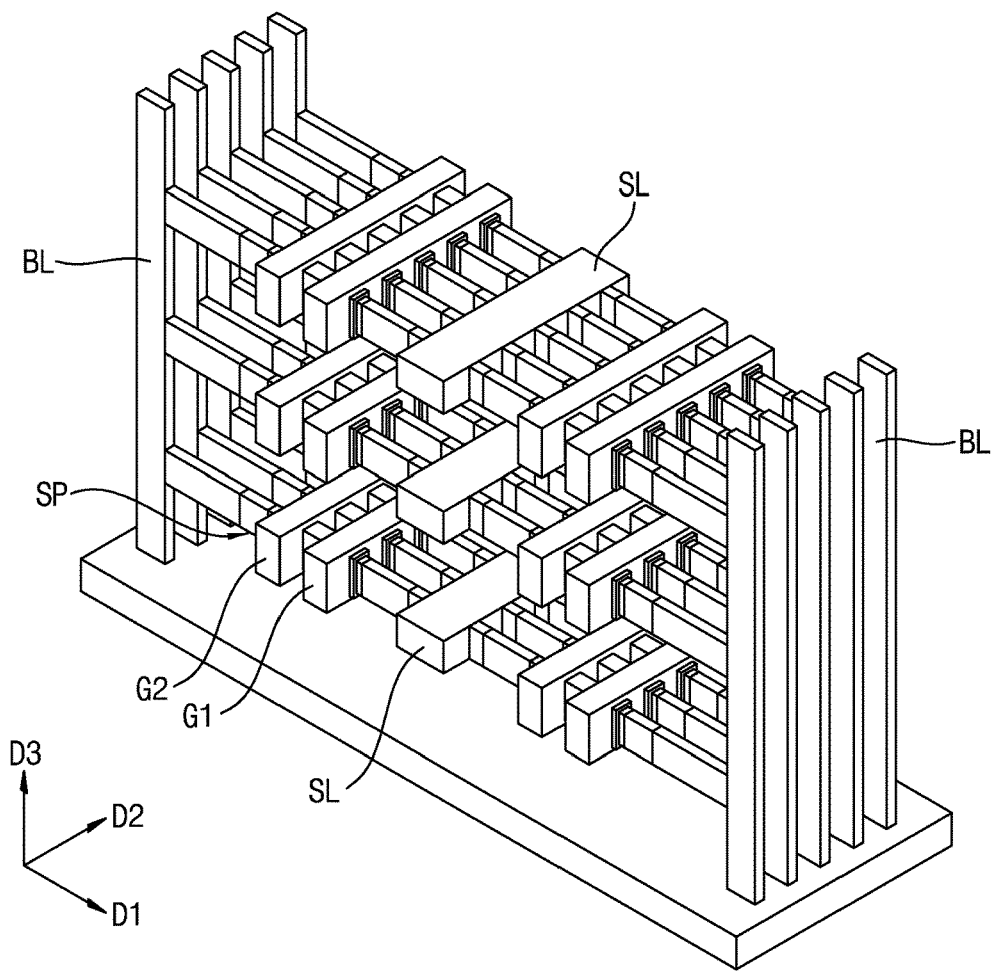
Figure 18:
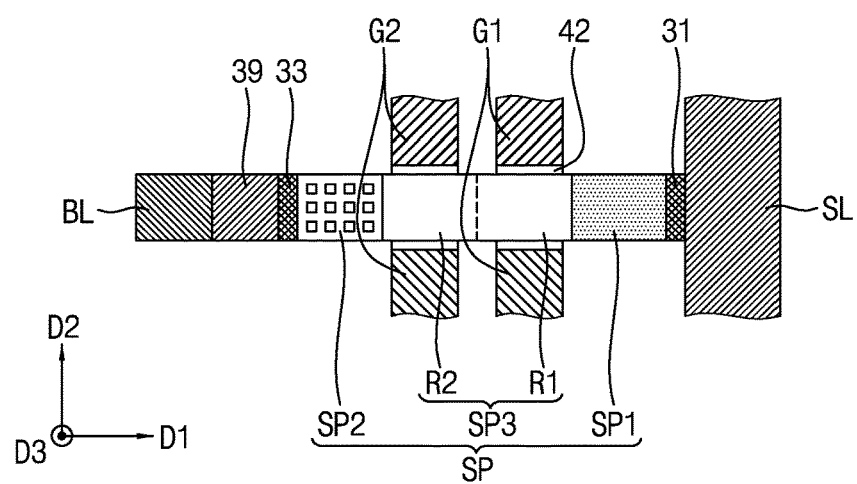

FIG. 17 is a perspective view of a semiconductor devices according to an exemplary embodiment of the present inventive concepts. FIG. 18 is a plan view of a layout of a semiconductor device corresponding to a portion of FIG. 17.

Referring to the exemplary embodiments of FIGS. 17 and 18, the plurality of source lines SL may be stacked in parallel in the third direction D3 and may extend longitudinally in the second direction D2. The plurality of bit lines BL may be arranged in parallel in the second direction D2 and may extend longitudinally in the third direction D3. Each of the plurality of first gate lines G1 and the plurality of second gate lines G2 may include a gate all around (GAA) structure. For example, each of the plurality of first gate lines G1 may surround upper, lower and side surfaces of the first region R1. Each of the plurality of second gate lines G2 may surround upper, lower and side surfaces of the second region R2.

Figure 19:
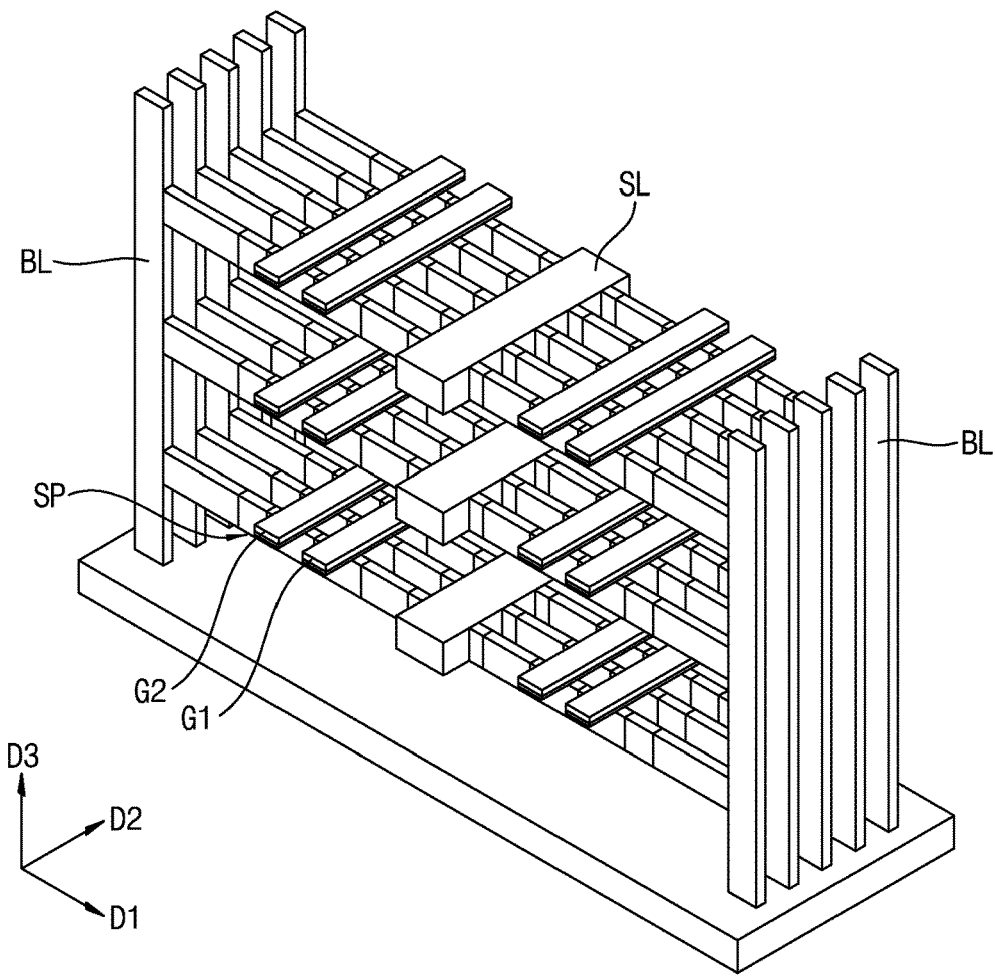
Figure 20:
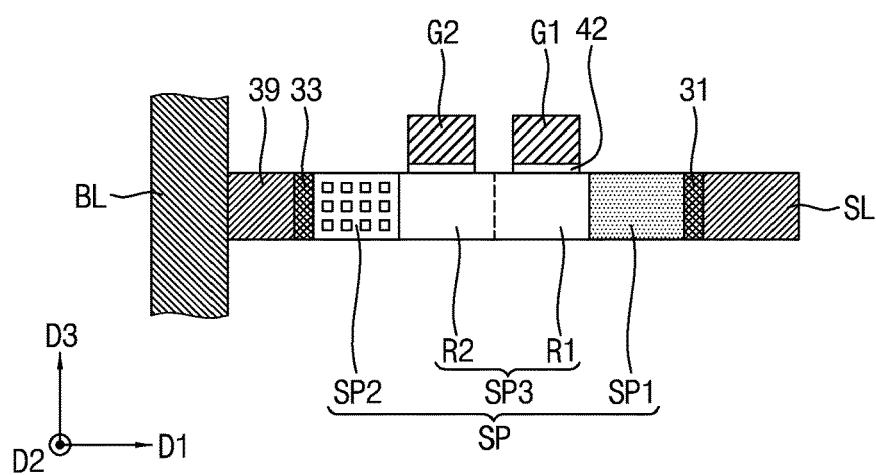

FIG. 19 is a perspective view of a semiconductor device according to an exemplary embodiment of the present inventive concepts. FIG. 20 is a plan view of a layout corresponding to a portion of FIG. 19.

Referring to the exemplary embodiments of FIGS. 19 and 20, the plurality of source lines SL may be stacked in parallel in the third direction D3 and may extend longitudinally in the second direction D2. The plurality of bit lines BL may be disposed in parallel in the second direction D2 and may extend longitudinally in the third direction D3. Each of the plurality of first gate lines G1 may cross an upper surface of the first region R1 in the second direction D2. Each of the plurality of second gate lines G2 may cross an upper surface of the second region R2 in the second direction D2. As shown in the exemplary embodiment of FIG. 20, the plurality of first gate lines G1 may be adjacent (e.g., in the third direction DR3) to only one side of the first region R1 of the third semiconductor pattern SP3. The plurality of second gate lines G2 may be adjacent (e.g., in the third direction DR3) to only one side of the second region R2 of the third semiconductor pattern SP3.

Figure 21:
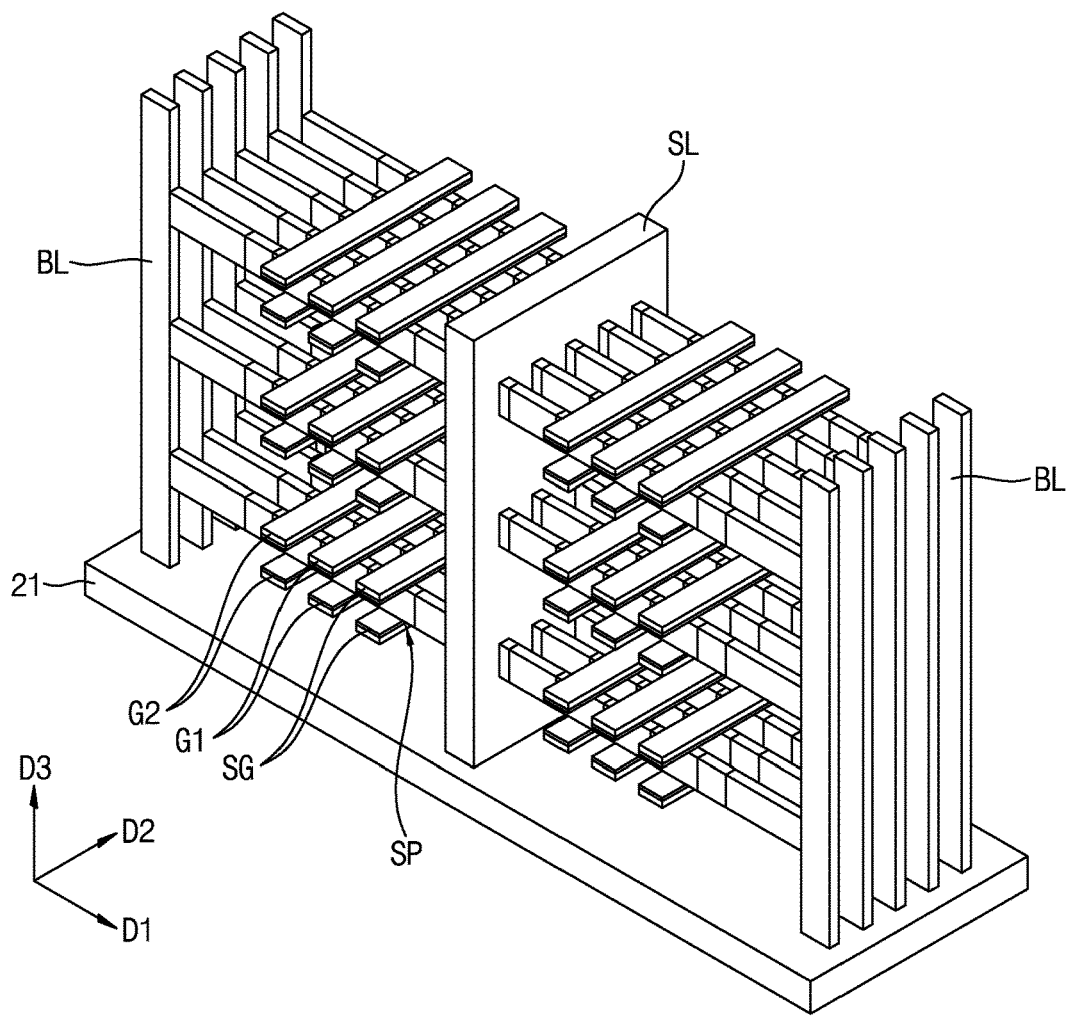
Figure 22:
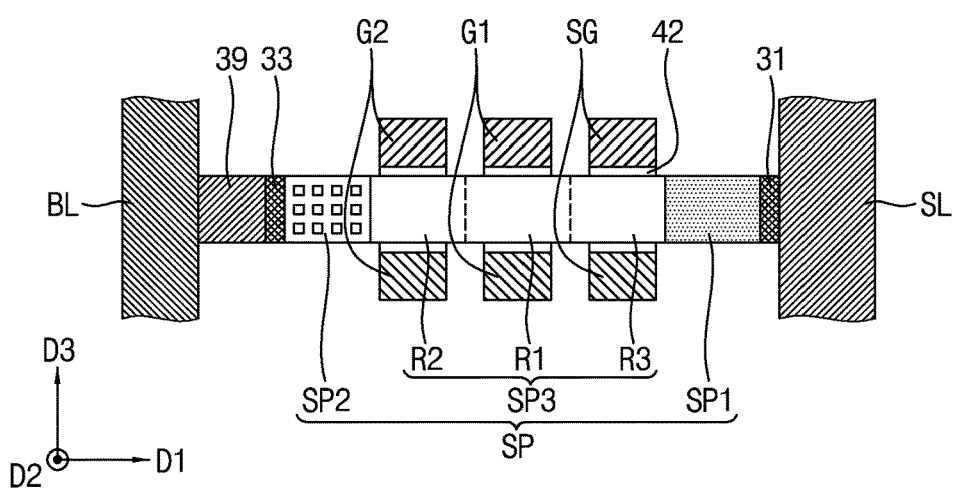

FIG. 21 is a perspective view of a semiconductor device according to an exemplary embodiment of the present inventive concepts. FIG. 22 is a plan view of a layout of a semiconductor device corresponding to a portion of FIG. 21.

Referring to the exemplary embodiments of FIGS. 21 and 22, the source lines SL may extend from the substrate 21 in the second direction D2 and the third direction D3. In an exemplary embodiment, the source lines SL may have a form of a wall. The plurality of bit lines BL may be arranged in parallel in the second direction D2 and may extend longitudinally in the third direction DR3.

Each of the plurality of semiconductor patterns SP may include a first semiconductor pattern SP1, a second semiconductor pattern SP2, and a third semiconductor pattern SP3. The third semiconductor pattern SP3 may include a first region R1, a second region R2, and a third region R3. Each of the plurality of first gate lines G1, the plurality of second gate lines G2 and the plurality of selection gate lines SG may extend longitudinally in the second direction D2 The plurality of first gate lines G1 may be arranged in parallel in the third direction D3. The plurality of second gate lines G2 may be arranged in parallel in the third direction D3. The plurality of selection gate lines SG may be arranged in parallel in the third direction D3.

Each of the plurality of first gate lines G1, the plurality of second gate lines G2 and the plurality of selection gate lines SG may include a double-gate structure. Each of the plurality of first gate lines G1 may include a pair of first gate lines G1. Each of the plurality of second gate lines G2 may include a pair of second gate lines G2. Each of the plurality of selection gate lines SG may include a pair of selection gate lines SG. The pair of selection gate lines SG may cross upper and lower surfaces of the third region R3 in the second direction D2, respectively. For example, the plurality of first gate lines G1 may be adjacent (e.g., in the third direction DR3) to the first region R1 of the third semiconductor pattern SP3. The plurality of second gate lines G2 may be adjacent (e.g., in the third direction DR3) to the second region R2 of the third semiconductor pattern SP3. The plurality of selection gate lines SG may be adjacent (e.g., in the third direction DR3) to the third region R3 of the third semiconductor pattern SP3.

The semiconductor device according to each of the exemplary embodiments of the present inventive concepts may include a plurality of semiconductor patterns SP on the substrate 21. Each of the plurality of semiconductor patterns SP may extend longitudinally in the first direction D1 parallel to the upper surface of the substrate 21. Some of the plurality of semiconductor patterns SP may be disposed in parallel to the upper surface of the substrate 21 while being arranged in parallel in the second direction D2 crossing the first direction D1 with respect to other semiconductor patterns SP. Each of the plurality of semiconductor patterns SP may include the first semiconductor pattern SP1, which includes the first-conductivity-type impurities, the second semiconductor pattern SP2, which includes the second-conductivity-type impurities that is different from the first-conductivity-type impurities, and the third semiconductor pattern SP3, which is disposed between the first semiconductor pattern SP1 and the second semiconductor pattern SP2 (e.g., in the first direction D1). As shown in the exemplary embodiment of FIG. 22, the third semiconductor pattern SP3 may include the first region R1, which is disposed closer to the first semiconductor pattern SP1 than the second region R2, and the second region R2, which is disposed between the first region R1 and the second semiconductor pattern SP2. At least one of the first region R1 and the second region R2 may include an intrinsic semiconductor layer.

The semiconductor device may include the source line SL, which is connected to the plurality of semiconductor patterns SP. The semiconductor device may include a plurality of bit lines BL, which is spaced apart from the source line SL. Each of the plurality of bit lines BL may extend longitudinally in the third direction D3 crossing the first direction D1 and the second direction D2. Each of the plurality of bit lines BL may be connected to a corresponding one of the plurality of semiconductor patterns SP. The semiconductor device may include first gate lines G1, which are disposed adjacent to the first region G1 of the third semiconductor pattern SP3 (e.g., in the third direction DR3) while extending in the second direction D2. The semiconductor device may include second gate lines G2, which are disposed adjacent to the second region R2 of the third semiconductor pattern SP3 (e.g., in the third direction DR3) while being parallel to the first gate lines G1. The first gate lines G1 may cross the first region R1. The second gate line G2 may cross the second region R2.

The third semiconductor pattern SP3 may include the third region R3 which is disposed between the first region R1 and the first semiconductor pattern SP1 (e.g., in the first direction D1). The semiconductor device may include the selection gate lines SG, which are disposed adjacent to the third region R3 of the third semiconductor pattern SP3 (e.g., in the third direction D3) while being parallel to the first gate lines G1 and the second gate lines G2. The selection gate lines SG may cross the third region R3.

Figure 23:
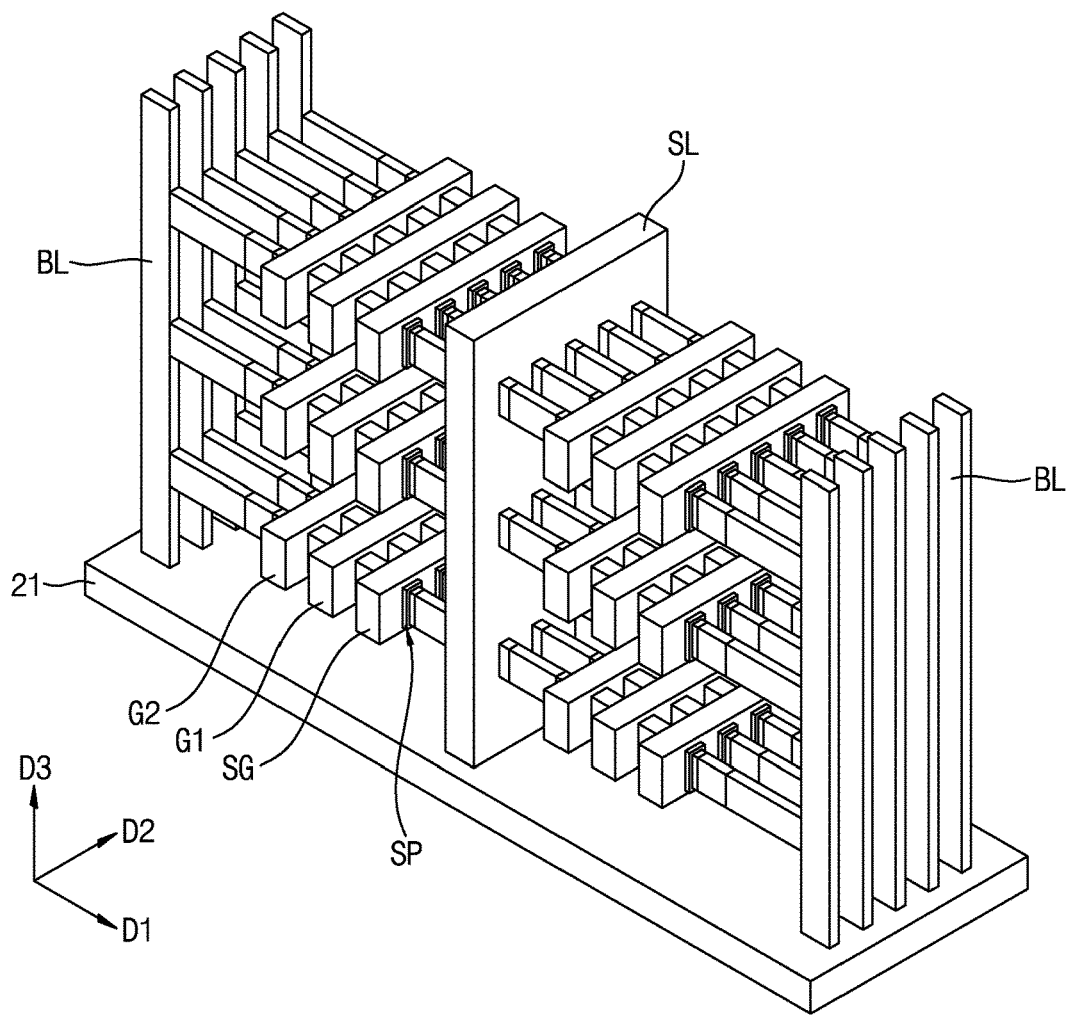
Figure 24:
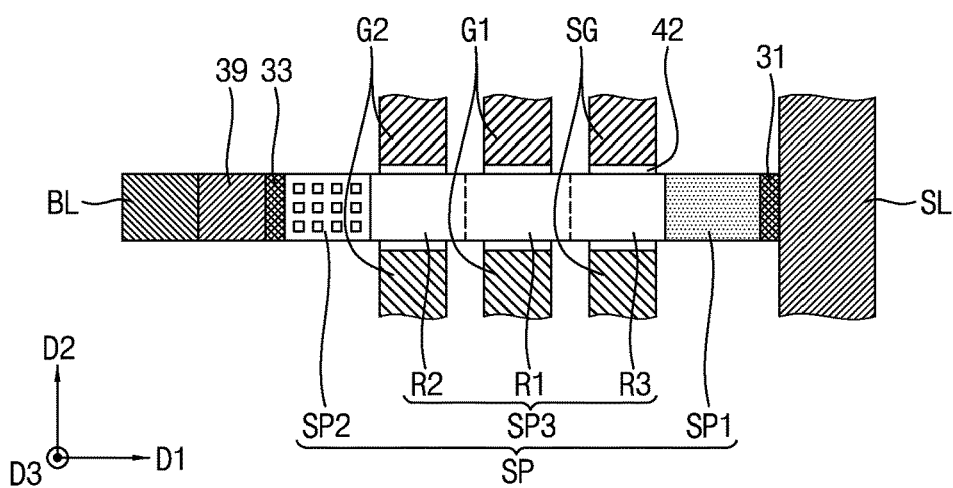

FIG. 23 is a perspective view of a semiconductor devices according to an exemplary embodiment of the present inventive concepts. FIG. 24 is a plan view of a layout of a semiconductor device corresponding to a portion of FIG. 23.

Referring to the exemplary embodiments of FIGS. 23 and 24, the source lines SL may extend from the substrate 21 in the second direction D2 and the third direction D3. The plurality of bit lines BL may be arranged in parallel in the second direction D2 and may be spaced apart from each other in the second direction D2. Each of the plurality of first gate lines G1, the plurality of second gate lines G2 and the plurality of selection gate lines SG may include a gate all around (GAA) structure. Each of the plurality of selection gate lines SG may surround upper, lower and side surfaces of the third region R3.

Figure 25:
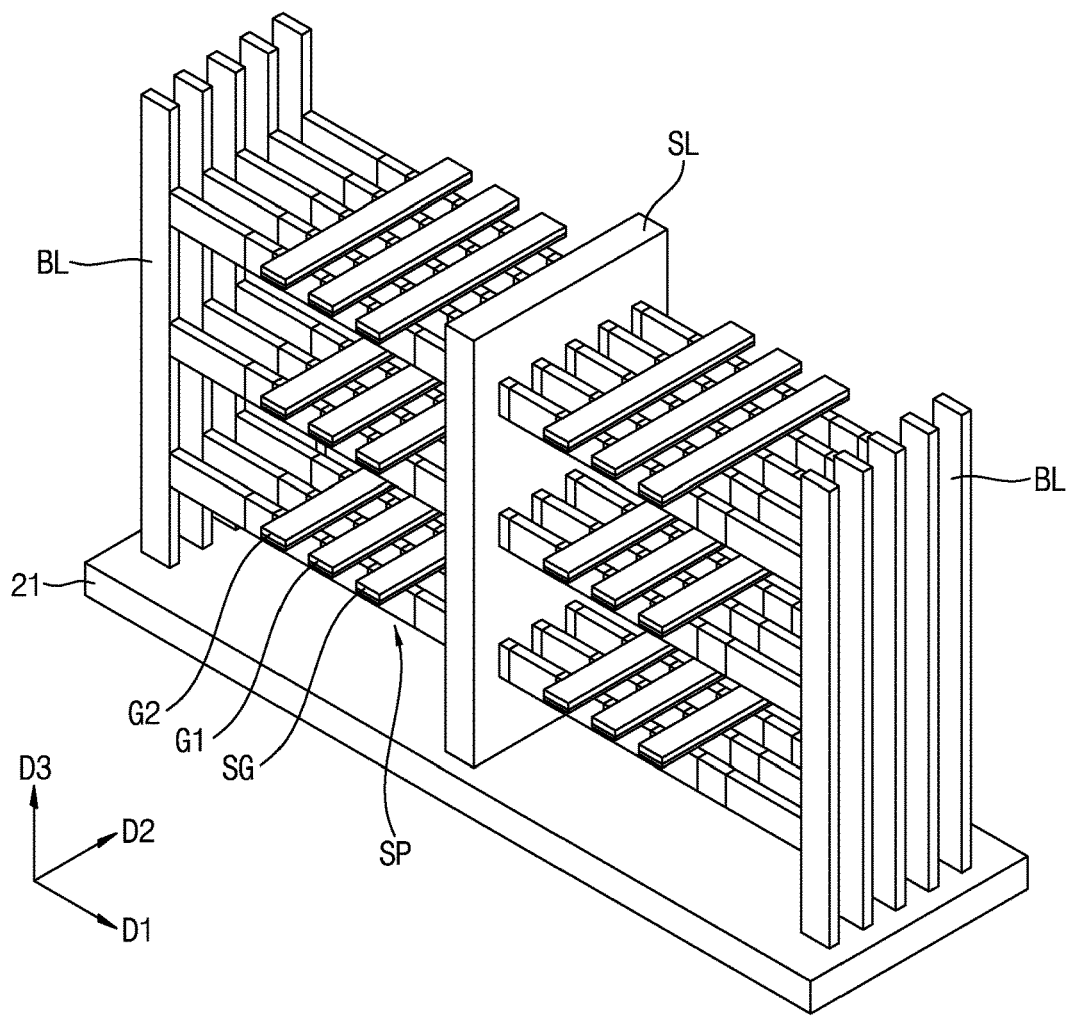
Figure 26:
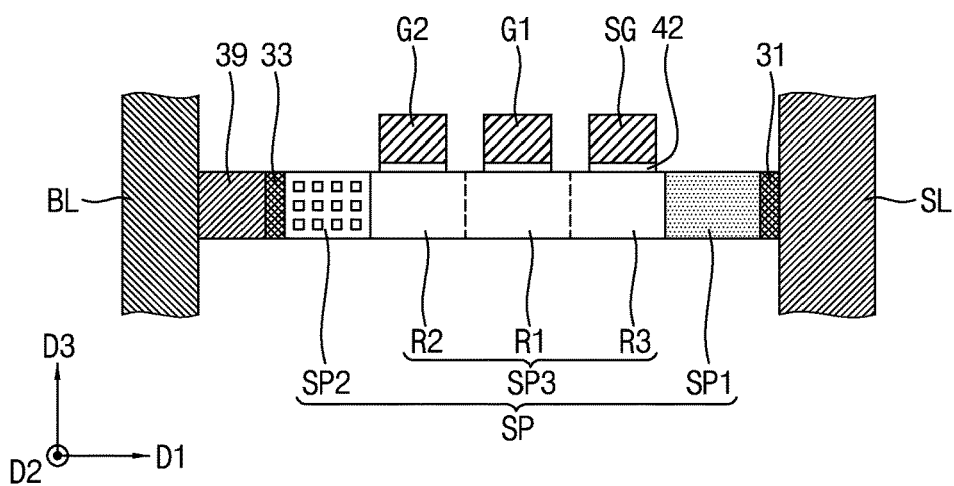

FIG. 25 is a perspective view of a semiconductor device according to an exemplary embodiment of the present inventive concepts. FIG. 26 is a plan view of a layout of a semiconductor device corresponding to a portion of FIG. 25.

Referring to the exemplary embodiments of FIGS. 25 and 26, the source lines SL may extend from the substrate 21 in the second direction D2 and the third direction D3. The plurality of bit lines BL may be arranged in parallel in the second direction D2 and may be spaced apart in the second direction D2. Each of the plurality of first gate lines G1 may cross an upper surface of the first region R1 in the second direction D2. Each of the plurality of second gate lines G2 may cross an upper surface of the second region R2 in the second direction D2. Each of the plurality of selection gate lines SG may cross an upper surface of the third region R3 in the second direction D2. For example, as shown in the exemplary embodiment of FIG. 26, the plurality of first gate lines G1 may be adjacent (e.g., in the third direction DR3) to only one side of the first region R1 of the third semiconductor pattern SP3. The plurality of second gate lines G2 may be adjacent (e.g., in the third direction DR3) to only one side of the second region R2 of the third semiconductor pattern SP3. The plurality of select gate lines SG may be adjacent (e.g., in the third direction DR3) to only one side of the third region R3 of the third semiconductor pattern SP3.

In accordance with exemplary embodiments of the present inventive concepts, a third semiconductor pattern including at least one intrinsic semiconductor layer is provided between a first semiconductor pattern and a second semiconductor pattern. First and second gate electrodes are disposed across the third semiconductor pattern. The third semiconductor pattern, which includes at least one intrinsic semiconductor layer, may have a structure that provides high integration while maintaining excellent electrical characteristics. Thus, semiconductor devices having excellent electrical characteristics while having high integration may be realized.

While exemplary embodiments of the present inventive concepts have been described with reference to the accompanying drawings, it should be understood by those skilled in the art that various modifications may be made without departing from the scope of the present inventive concepts and without changing essential features thereof. Therefore, the above-described exemplary embodiments should be considered in a descriptive sense only and not for purposes of limitation.

What is claimed is:

1. A semiconductor device comprising:
a substrate having an upper surface extending in a first horizontal direction and a second horizontal direction crossing the first horizontal direction;
a first conductive line extending longitudinally in the first horizontal direction on the substrate;
a second conductive line spaced apart from the first conductive line in the second horizontal direction and extending longitudinally in a vertical direction on the substrate, the vertical direction is perpendicular to the upper surface of the substrate;
a semiconductor pattern disposed between the first conductive line and the second conductive line, the semiconductor pattern including:
a first semiconductor pattern disposed adjacent to the first conductive line, the first semiconductor pattern having first-conductivity-type impurities;
a second semiconductor pattern disposed adjacent to the second conductive line, the second semiconductor pattern having second-conductivity-type impurities that are different from the first-conductivity-type impurities; and
a third semiconductor pattern disposed between the first semiconductor pattern and the second semiconductor pattern, the third semiconductor pattern including a first region disposed adjacent to the first semiconductor pattern and a second region disposed between the first region and the second semiconductor pattern, wherein at least one of the first region and the second region comprises an intrinsic semiconductor layer, wherein the first to third semiconductor patterns extend longitudinally in the second horizontal direction and are contiguously arranged in the second horizontal direction;
a first gate line crossing the first region and extending in the first horizontal direction; and
a second gate line crossing the second region and extending in the first horizontal direction, wherein the first and second gate lines control a same active device.

2. The semiconductor device of claim 1, wherein each of the first region and the second region comprises the intrinsic semiconductor layer.

3. The semiconductor device of claim 1, wherein:
the first region comprises the intrinsic semiconductor layer; and
the second region comprises a semiconductor layer having the first-conductivity-type impurities.

4. The semiconductor device of claim 1, wherein:
the first region comprises a semiconductor layer having the second-conductivity-type impurities; and
the second region comprises the intrinsic semiconductor layer.

5. The semiconductor device of claim 1, wherein each of the first semiconductor pattern, the second semiconductor pattern and the third semiconductor pattern comprises at least one compound selected from silicon, germanium, silicon-germanium, and indium gallium zinc oxide (IGZO).

6. The semiconductor device of claim 1, further comprising:
a first barrier layer disposed between the first conductive line and the first semiconductor pattern; and
a second barrier layer disposed between the second conductive line and the second semiconductor pattern,
wherein the first conductive line is electrically connected to the first semiconductor pattern via the first barrier layer, and
the second conductive line is electrically connected to the second semiconductor pattern via the second barrier layer.

7. The semiconductor device of claim 1, wherein:
the first gate line surrounds upper, lower and side surfaces of the first region, and
the second gate line surrounds upper, lower and side surfaces of the second region.

8. The semiconductor device of claim 1, wherein:
the first gate line crosses an upper surface of the first region, and
the second gate line crosses an upper surface of the second region.

9. A semiconductor device comprising:
a plurality of semiconductor patterns disposed on a substrate, each of the plurality of semiconductor patterns extending longitudinally in a first horizontal direction that is parallel to an upper surface of the substrate, each of the plurality of semiconductor patterns including:
a first semiconductor pattern having first-conductivity-type impurities, a second semiconductor pattern having second-conductivity-type impurities that are different from the first-conductivity-type impurities, and a third semiconductor pattern disposed between the first semiconductor pattern and the second semiconductor pattern, wherein the first to third semiconductor patterns are contiguously arranged in the first horizontal direction,
the third semiconductor pattern includes a first region disposed adjacent to the first semiconductor pattern and a second region disposed between the first region and the second semiconductor pattern, wherein at least one of the first region and the second region comprises an intrinsic semiconductor layer;
a plurality of first conductive lines extending in a second horizontal direction parallel to the upper surface of the substrate and crossing the first horizontal direction, the plurality of first conductive lines is spaced apart from each other in a vertical direction perpendicular to the upper surface of the substrate;

a plurality of second conductive lines spaced apart from the first conductive line in the first horizontal direction, extending longitudinally in the vertical direction and spaced apart from each other in the second horizontal direction, each of the plurality of second conductive lines is connected to a corresponding one of the plurality of semiconductor patterns;

a plurality of first gate lines extending in the second horizontal direction, each of the plurality of first gate lines crosses a first region of a corresponding one of the plurality of semiconductor patterns; and a plurality of second gate lines extending in the second horizontal direction, each of the plurality of the second gate lines crosses a second region of a corresponding one of the plurality of semiconductor patterns.

10. The semiconductor device of claim 9, wherein the plurality of first gate lines including a pair of first gate lines on upper surfaces and lower surfaces of the first regions of the plurality of semiconductor patterns, respectively.

11. The semiconductor device of claim 9, wherein the plurality of second gate lines including a pair of second gate lines on upper surfaces and lower surfaces of the second regions of the plurality of semiconductor patterns, respectively.

* * * * *